United States Patent
Ishihara

(10) Patent No.: US 6,531,920 B1
(45) Date of Patent: Mar. 11, 2003

(54) DIFFERENTIAL AMPLIFIER CIRCUIT

(75) Inventor: Hisaya Ishihara, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/160,177

(22) Filed: Jun. 4, 2002

(30) Foreign Application Priority Data

Jun. 7, 2001 (JP) ........................................ 2001-172393

(51) Int. Cl.$^7$ .............................. H03F 3/45; G06F 7/44
(52) U.S. Cl. ..................... 330/254; 330/260; 327/359
(58) Field of Search ............................. 330/254, 260; 327/359

(56) References Cited

U.S. PATENT DOCUMENTS

| | | | | |
|---|---|---|---|---|
| 5,157,350 A | * | 10/1992 | Rubens | 330/254 |
| 5,642,071 A | * | 6/1997 | Sevenhans et al. | 327/359 |
| 6,111,463 A | * | 8/2000 | Kimura | 330/254 |
| 6,466,595 B2 | * | 10/2002 | Asano | 372/29.021 |

FOREIGN PATENT DOCUMENTS

JP      8-250941      9/1996

OTHER PUBLICATIONS

Koyama, et al. "A 2.5–V Active Low–Pass Filter Using All–n–p–n Gilbert Cells With a 1–V p–p Linear Input Range", IEEE Journal of Solid–State Circuits, vol. 28, No. 12, Dec. 1993.

* cited by examiner

Primary Examiner—Patricia Nguyen
(74) Attorney, Agent, or Firm—Dickstein, Shapiro, Morin & Oshinsky, L.L.P.

(57) ABSTRACT

The differential amplifier circuit of the invention comprises operational amplifiers 3 and 4 having the negative inputs connected to input terminals 1 and 2 respectively, transistors 21 and 22 having the bases connected to each of the outputs of the operational amplifiers 3 and 4 respectively, constant current sources 41 and 42 connected between each emitter of the transistors 21 and 22 and a ground terminal 8 respectively, constant current sources 43 and 44 connected between each collector of the transistors 21 and 22 and a power supply terminal 7 respectively, a resistor 31 connected between the collectors of the transistors 21 and 22, transistors 23 and 24 having the emitters connected to each emitter of the transistors 21 and 22 respectively and the bases commonly connected to each other, and load resistors 32 and 33 connected between each collector of the transistors 23 and 24 and the power supply terminal 7 respectively.

10 Claims, 15 Drawing Sheets

DIFFERENTIAL AMPLIFIER CIRCUIT

BACKGROUND OF THE INVENTION

1. Field of the Invention

The invention relates to differential amplifiers and, more particularly, to a differential amplifier having a characteristic of low distortion even during low voltage operation and applicable for mixer circuits and variable gain amplifier circuits.

2. Description of the Prior Art

It is a known fact that in recent years, portable electronic equipment including portable telephones has been widely used in society. Also, it is well known that in radio systems to which portable electronic equipment is applied, in order to ensure a long calling time during battery-driven operation of the equipment, there have been demands for a reduction of the driving voltage of the portable electronic equipment, which is effective for reducing power consumption of the radio systems.

Further, it is well known that a differential amplifier circuit, a mixer circuit, and a variable gain amplifier circuit each are required to have a characteristic of low distortion to suppress an interference to an adjacent channel and deterioration in bit error rate caused by its inputting of disturbance waves.

However, the demands for lower supply voltage of portable equipment results in narrowing of its dynamic range for input/output signals, conflicting with the demands for lower distortion of the portable equipment. For this reason, it is very difficult to satisfy these two demands at the same time.

For these demands, a differential amplifier circuit improved in non-linearity (first conventional differential amplifier) is reported in a paper M. Koyama et. al., "A 2.5-V Active Low-Pass Filter Using All -n-p-n Gilbert Cells with a 1-$V_{p-p}$ Linear Input Range" (IEEE J. Solid State Circuits, Vol., SC-28, No. 12, pp. 1246–1253, Dec. 1993).

Further, a differential amplifier circuit (second conventional amplifier circuit) enabling the first conventional differential amplifier circuit to operate at low voltage is disclosed, for example, in Japanese Patent Laid-Open No. 8-250941.

Hereinafter, these conventional circuits will be described. First, the first conventional differential amplifier will be described.

FIG. 2 shows the first conventional differential amplifier circuit which is shown in the report "A 2.5-V Active Low-Pass Filter Using All -n-p-n Gilbert Cells with a 1-$V_{p-p}$ Linear Input Range".

Referring to FIG. 2, the first conventional differential amplifier circuit comprises two input terminals 51 and 52, two operational amplifiers 53 and 54 having the positive inputs connected to the input terminals 51 and 52 respectively, NPN transistors 71 and 72 having the bases connected to each output of the operational amplifiers 71 and 72 respectively, constant current sources 91 and 92 connected between each emitter of the transistors 71 and 72, and a ground terminal 58 respectively, a feedback resistor 81 connected between the emitters of the transistors 71 and 72, and load resistors 82 and 83 connected between each collector of the transistors 71 and 72 and a power supply terminal 57 respectively, wherein each emitter of the transistors 71 and 72 is connected to each negative input of the operational amplifiers 53 and 54 respectively, and each collector of the transistors 71 and 72 is connected to each of output terminals 61 and 62 respectively.

The first conventional differential amplifier circuit configured as described above operates as follows.

That is, in the first conventional differential amplifier circuit, a input voltage Vin inputted between a pair of the input terminals 51 and 52 is directly applied across the feedback resistor 81 through a pair of voltage follower circuits consisting of a set of the operational amplifier 53 and the transistor 71 and a set of the operational amplifier 54 and the transistor 72. Herein, since the feedback resistor 81 is a linear element, a linear current flows through the resistor 81 according to a voltage applied across the resistor.

In the circuit of FIG. 2, the resistance value of the feedback resistor 81 is represented as RFB1 and a signal current flowing through the feedback resistor 81 is represented as i. Then, the relation between RFB1 and i can be expressed by the following equation.

$$i=(Vin/RFB1) \qquad (1)$$

A current given by the equation (1) flows through the respective emitters of the transistors 71 and 72 as a positive current and a negative current, respectively. Further, if the base currents flowing through the transistors 71 and 72 can be neglected because of the high current gain of the transistors, their emitter currents are equal to their collector currents. Therefore, the linear current given by the equation (1) is supplied through the load resistors 82 and 83.

Herein, clearly from the equation (1), the transconductance Gm of the differential amplifier circuit of FIG. 2 can be expressed by the following equation.

$$Gm=(i/Vin)=(1/RFB1) \qquad (2)$$

Further, the above respective collector currents are converted into the corresponding voltages through the load resistors 82 and 83 inserted between each collector of the transistors 71 and 72 and the power supply terminal 57, and the resultant voltages are outputted to output terminals 61 and 62.

By representing the resistance values of the load resistors 82 and 83 as RC, the voltage gain G of the differential amplifier circuit of FIG. 2 can be expressed by the following equation, using equation (2).

$$G=Gm \cdot Rc=(Rc/RFB1) \qquad (3)$$

On the other hand, when the current values of the constant current sources 91 and 92 each are represented as I0, the linear Input Dynamic Range (IDR) of the differential amplifier circuit of FIG. 2 can be expressed by the following equation.

$$IDR=I0 \cdot RFB1 \qquad (4)$$

Also, the dc potential V0 (DC) of the output terminals can be expressed by the following equation.

$$V0(DC)=Vcc-I0 \cdot Rc \qquad (5)$$

As described above, the first conventional differential amplifier circuit can provide a linear output voltage according to an input voltage Vin without being affected by the non-linearity of the differential pair of the input transistors 71 and 72.

FIG. 3 shows an example of the relations of input voltage (Vin) and transconductance (Gm) and output current (io, iob) for the first conventional differential amplifier circuit shown in FIG. 2. In addition, FIG. 3 also shows the relations of input voltage versus transconductance and output current for a most basic differential amplifier circuit with an emitter feedback resistor shown in FIG. 1.

In the example of FIG. 3, the resistance value RFB1 of the feedback resistor 81 is assumed to be 2000Ω and the currents I0 of the constant current sources 91 and 92 each are assumed to be 0.45 mA. It can be seen from FIG. 3 that the first conventional differential amplifier circuit is superior in linearity to the differential amplifier circuit with an emitter feedback resistor shown in FIG. 1.

The circuit diagram of FIG. 4 shows a configuration of the first conventional differential amplifier circuit and the potential of each node therein. Herein, only a half of the circuit is shown because of the symmetry of the differential amplifier circuit.

Therein, the base of a transistor 531, the base and the collector of a transistor 532 serve as a positive input, a negative input and an output of the operational amplifier 53 respectively, and the transistor 71 configures a voltage follower circuit. For this reason, when the potential of the input terminal 51 is represented as Vin, the base potential of the transistor 532 is also Vin, and therefore the base potential of the transistor 71 becomes (Vin+VBEQ71).

Next, the second conventional differential amplifier circuit will be described.

FIG. 5 shows the second conventional differential amplifier circuit shown in Japanese Patent Laid-Open No. 8-250941.

The second conventional differential amplifier circuit comprises, in addition to the first conventional differential amplifier circuit, transistors 77 and 78 connected in diode connection (collector and base are shorted ) and constant current sources 93 and 94 connected between each collector of the transistors 77 and 78 and the power supply terminal 57. Thus, when compared to the differential amplifier circuit shown in FIG. 2, the transistors 77 and 78 have the emitters connected to the emitters of the transistors 71 and 72 respectively, and the bases connected to the negative inputs of the operational amplifiers 53 and 54 respectively.

The second conventional differential amplifier circuit operates as described below.

That is, an input voltage Vin inputted between a pair of the input terminals 51 and 52 is shifted in dc voltage by the base-to-emitter voltage VBE of the diode-connected transistors 77 and 78 through a pair of voltage follower circuits, which are configured by the operational amplifier 53, transistor 71 and diode-connected transistor 77, and the operational amplifier 54, transistor 72 and diode-connected transistor 78. Then, the input voltage shifted is applied across the feedback resistor 81. Herein, since the feedback resistor 81 is a linear element, thus linear currents flow through the resistor according to the voltages applied across it.

In the second conventional differential circuit, the resistance value of the feedback resistor 81 is represented as RFB2 and a signal current flowing through the feedback resistor 81 is represented as i. Then, the relation between RFB1 and i can be expressed by the following equation.

$$i = (Vin/RFB2) \quad (6)$$

A current given by the equation (6) flows through each emitter of the transistors 71 and 72 as a positive current and a negative current, respectively. Further, if the same assumption as in the first conventional circuit is made, the emitter currents of the transistors 71 and 72 are equal to their collector currents. Therefore, the linear current given by the equation (6) is supplied to the load resistors 82 and 83.

Herein, clearly from the equation (6), the transconductance Gm of the differential amplifier circuit of FIG. 5 can be expressed by the following equation.

$$Gm = (i/Vin) = (1/RFB2) \quad (7)$$

Further, the above collector currents are converted into the corresponding voltages through the load resistors 82 and 83 connected between each collector of the transistors 71 and 72 and the power supply terminal 57, and the resultant voltages are output to output terminals 61 and 62.

By representing the resistance values of the load resistors 82 and 83 as RC, the voltage gain G of the differential amplifier circuit of FIG. 5 can be expressed by the following equation.

$$G = Gm \cdot Rc = (Rc/RFB2) \quad (8)$$

On the other hand, when each current value of the constant current sources 91 and 92 is assumed to be 2I0 and each current value of the constant current sources 93 and 94 is assumed to be I0, the linear Input Dynamic Range (IDR) of the differential amplifier circuit of FIG. 5 can be expressed by the following equation (9).

$$IDR = I0 \cdot RFB2 \quad (9)$$

Also, the dc potential V0 (DC) of the output terminals can be expressed by the following equation.

$$V0(DC) = Vcc - I0 \cdot Rc \quad (10)$$

As described above, the second conventional differential amplifier circuit also can provide linear output voltages according to input voltages Vin without being affected by the non-linearity of the differential pair of the input transistors 71 and 72, in the same manner as the first conventional differential amplifier.

FIG. 6 shows an example of the relations of input voltages (Vin) versus transconductance (Gm) and output current (io, iob) for the second conventional differential amplifier circuit shown in FIG. 5.

In the example of FIG. 6, the resistance value RFB2 of the feedback resistor 81 is assumed to be 2000Ω, the currents of the constant current sources 91 and 92 are assumed to be 2I0, and the currents of the constant current sources 93 and 94 are assumed to be I0, wherein I0 is assumed to be 0.45 mA.

By the way, the difference between the first and second conventional circuits is in that the diode-connected transistors 77 and 78 are inserted between the emitters of the transistors 71 and 72 and the negative inputs of the operational amplifiers 53 and 54.

Next, the effect of these diode-connected transistors 77 and 78 will be described.

The circuit diagram of FIG. 7 shows a configuration of the second conventional circuit and the potential of each node therein. Herein, only a half of the circuit is shown because of the symmetry of the differential amplifier circuit.

Therein, the base of a transistor 531, the base and the collector of a transistor 532 serve as a positive input, a negative input and an output of the operational amplifier 53, respectively, and a voltage follower circuit is configured by the transistors 71 and 77. For this reason, when the potential of the input terminal 51 is represented as Vin, the base potential of the transistor 532 is given as Vin, and the emitter potential of the transistor 77 is given as Vin−VBEQ77. Therefore, the base potential of the transistor 71 is then given as Vin−VBEQ77+VBEQ71.

Further, because the base-to-emitter voltage VBE of transistors can be considered to be approximately constant, the base potential of the transistor 71 becomes equal to Vin. On the other hand, in the case of the first conventional differential amplifier circuit, because the diode-connected transistor 77 is not included therein, the emitter potential of the transistor 71 is Vin and the base potential thereof is Vin+VBEQ71. Thus, the base potential of the transistor 71 is higher by one stage of VBE as compared with the second conventional differential amplifier circuit.

This fact means that the second conventional differential amplifier circuit can be operated at lower voltage than the first conventional differential amplifier circuit.

However, the above conventional differential amplifier circuits have the following problem.

That is, in attempting to apply the differential amplifier circuit of FIG. 5 to a mixer circuit and a variable gain amplifier circuit, then a configuration of three vertical stacks of NPN transistors is required, thus causing a problem that high gain can not be obtained during low voltage operation.

Hereinafter, the reason for the occurrence of the above problem will be described with reference to figures.

FIG. 8 shows a circuit configuration for applying the second conventional differential amplifier circuit to a mixer circuit.

The mixer circuit shown in FIG. 8 comprises, in addition to the differential amplifier circuit shown in FIG. 5, two differential pairs of transistors 73, 75 and 74, 76 where each pair of transistors have the emitters connected to each other, and a set of local oscillator signal input terminals 63 and 64, wherein the input terminal 63 is connected to the commonly-connected bases of the transistors 73 and 74 and the input terminal 64 is connected to the commonly-connected bases of the transistors 75 and 76.

Also, the collector of the transistor 73 is connected to the collector of the transistor 76 and the collector of the transistor 74 is connected to the collector of the transistor 75, and the commonly-connected emitters of the transistors 73 and 75 are connected to the collector of the transistor 71 and the commonly-connected emitters of the transistors 74 and 76 are connected to the collector of the transistor 72.

Further, the commonly-connected collectors of the transistors 73 and 76 are coupled to the power supply terminal 57 through a load resistor 82 and the commonly-connected collectors of the transistors 74 and 75 are coupled to the power supply terminal 57 through a load resistor 83.

The conversion gain CG of the mixer circuit using this second conventional differential amplifier circuit can be calculated in the same manner as the gain of double balanced mixers used widely in general.

That is, if the dual differential pairs of transistors in double balanced mixers are switching operated by a local oscillator signal, the following equation is held between the gain G of the differential amplifier circuits and the conversion gain CG of the mixer circuit therein.

$$CG=(2/\pi)\cdot G \tag{11}$$

Therefore, the conversion gain CG of the mixer circuit using the second conventional circuit can be expressed by the following equation from the equations (8) and (11).

$$CG=(2/\pi)\cdot(Rc/RFB2) \tag{12}$$

Herein, it can be understood from the equation (12) that increased values of the conversion gain CG require increased resistance values Rc of the load resistors 82 and 83. For this reason, it can be understood that the base potential of the transistor 73 (or 74, 75, 76) is preferably lower.

Therefore, the lowest base potential of the transistor 73 (or 74, 75, 76) will be determined. The circuit diagram of FIG. 9 shows each potential of the nodes in the mixer circuit of FIG. 8. Herein, only a half of the circuit is shown in FIG. 9 because of the symmetry of the differential amplifier circuit. Further, for the purpose of simplicity, the voltage drops developed across emitter resistors of constant current supply transistors will be neglected.

First, when Vin is lowest, the conditions under which constant current supply transistors 533 and 911 can not be saturated are expressed by the following equations.

$$Vin\ (min)>VCE(sat)Q533+VBEQ531 \tag{11a}$$

$$Vin\ (min)>VCE(sat)Q911+VBEQ71 \tag{11b}$$

Therefore, the lowest input voltage Vin (min) can be expressed by the following equation from the equations (11a) and (11b) However, because emitter-to-base voltages VBE of transistors can be considered to be approximately constant, the equations (11a) and (11b) are considered to be equal.

$$Vin\ (min)=VCE(sat)Q533+VBEQ531 \tag{11c}$$

Next, when Vin is highest, the condition under which the transistor 71 can not be saturated is given by the following equation.

$$VLO>Vin\ (max)-VBEQ71+VCE(sat)Q71+VBEQ73 \tag{13}$$

Therefore, the lowest base potential of the transistor 73 can be expressed by the following equation from the equation (13).

$$VLO=Vin\ (max)-VBEQ71+VCE(sat)Q71+VBEQ73 \tag{14}$$

Further, when the voltage of the power supply is assumed to be Vcc, the range of output voltages $\Delta V0$ is given by the following equation.

$$\Delta V0=Vcc-(VLO-VBEQ73+VCE(sat)Q73)=Vcc-(Vin\ (max)-VBEQ71+VCE(sat)Q71+VBEQ73-VBEQ73+VCE(sat)Q73) \tag{15}$$

On the other hand, in order to prevent the saturation of the transistors caused by decreased voltage and temperature variations, it is also desirable that the dc potential of output signals is set at the center of the output voltage range $\Delta V0$ given the equation (15) so as to provide the widest range of linear output voltage.

This fact requires the relations expressed by the two following equations.

$$(\Delta V0/2)=I0\cdot Rc \tag{16}$$

$$CG=(2/\pi)\cdot(I1/RFB2)\cdot(\Delta V0/2I0) \tag{17}$$

Herein, assuming that the power supply voltage Vcc is 1.8 V, the input voltage Vin is 0.5 Vp-p, and the base-to-emitter voltage VBE and the collector-to-emitter saturation voltage VCE(sat) of the transistors are constant voltages of 0.7 V and 0.15 V respectively, first from equation (11c), the minimum value Vin (min) of the input voltages is expressed by the following equation.

$$Vin\ (min)=0.15+0.7=0.85 \tag{18}$$

Also, the maximum value Vin (max) of the input voltages is expressed by the following equation.

$$Vin\ (max)=Vin\ (min)+Vin=0.85+0.5=1.35 \tag{19}$$

Then, by substituting the value of the equation (19) into the equation (14), the minimum base potential of the transistor 73 can be obtained as the following value.

$$VLO = 1.35 - 0.7 + 0.15 + 0.7 = 1.5 \tag{20}$$

Further, by substituting the values of the equations (18) and (19) into the equation (15), the output voltage range $\Delta V0$ is obtained as the following value.

$$\Delta V0 = 1.8 - (1.35 - 0.7 + 0.15 + 0.7 - 0.7 + 0.15) = 0.85 \tag{21}$$

That is, the output voltage range $\Delta V0$ is becomes 0.85 Vp-p, meaning that the output voltage range is, at most, only 47% of the power supply voltage Vcc.

Further, assuming that RFB2 is 2000Ω and I0 is 0.45 mA, the conversion gain CG obtained is only the order of about 0.300 (times).

The invention has been performed in views of such circumstances, and it has an object to provide a differential amplifier circuit having low distortion, which can provide high voltage gain even during low voltage operation when used for mixer circuits and variable gain amplifier circuits.

The invention has another object to provide a differential amplifier circuit having low distortion applicable to a three-input mixer circuit that is not operated at low voltage.

SUMMARY OF THE INVENTION

An object of the invention is to improve the above-described drawbacks of the conventional technologies and to provide a differential amplifier circuit having low distortion, which can provide high voltage gain even during low voltage operation particularly when used for mixer circuits and variable gain amplifier circuits.

Another object of the invention is to provide a differential amplifier circuit having low distortion applicable to a three-input mixer circuit that is not operated at low voltage.

According to the invention, the differential amplifier circuit comprises a first and second input terminals, a first and second operational amplifiers whose negative inputs are connected to each of the first and second input terminals respectively, a first and second transistors whose bases are connected to each output of the first and second operational amplifiers respectively, a first and second constant current sources connected between each emitter of the first and second transistors and a ground terminal respectively, a third and fourth constant current sources connected between each collector of the first and second transistors and a power supply terminal respectively, a first resistor connected between the collectors of the first and second transistors, and a pair of transistors having the emitters connected to each emitter of the first and second transistors and the bases connected to each other, wherein the collectors of the first and second transistors are connected to the positive inputs of the first and second operational amplifiers respectively, the commonly-connected bases of the pair of transistors are connected to input terminals for inputting a predetermined signal, and the collectors of the pair of transistors form a set of output terminals and output a set of output currents from the set of output terminals according to an input voltage applied between the first and second input terminals.

Further, all the transistors included in the differential amplifier circuit according to the invention are configured by NPN transistors.

Also, according to the invention, the mixer circuit comprises a first and second input terminals, a first and second operational amplifiers whose negative inputs are connected to each of the first and second input terminals respectively, a first and second transistors whose bases are connected to each output of the first and second operational amplifiers respectively, a first and second constant current sources connected between each emitter of the first and second transistors and a ground terminal respectively, a third and fourth constant current sources connected between each collector of the first and second transistors and a power supply terminal respectively, a first resistor connected between the collectors of the first and second transistors, a pair of transistors having the emitters connected to each emitter of the first and second transistors and the bases connected to each other, and a fifth and sixth transistors whose bases are connected to each other, wherein the collectors of the first and second transistors are connected to the positive inputs of the first and second operational amplifiers respectively, the commonly-connected bases of the pair of transistors are connected to input terminals for inputting a predetermined signal, and the commonly-connected bases of the fifth transistor and the sixth transistor, together with the commonly-connected bases of a third and fourth transistors forming the pair of transistors, are connected to a set of local oscillator signal input terminals, and the collectors of the third and fourth transistors are connected to the collectors of the sixth transistor and the fifth transistor respectively and also coupled to the power supply terminal through a first and second load resistors respectively.

Further, the mixer circuit according to the invention can be adapted for various suitable application forms described below.

That is, according to the invention, the mixer circuit may further have a seventh and eighth transistors whose bases are connected to each other, and a ninth and tenth transistors whose bases are connected to each other, wherein the commonly-connected bases of the seventh and eighth transistors and the commonly-connected bases of the ninth and tenth transistors each are connected to a set of second local oscillator signal input terminals, each collector of the seventh and eighth transistors is connected to each collector of the tenth and ninth transistors respectively and also coupled to the power supply terminal through the first and second load resistor respectively, the emitters of the seventh and ninth transistors are connected to each other and also connected to the collector of the fifth transistor, the emitters of the eighth and tenth transistors are connected to each other and also connected to the collector of the sixth transistor, the collectors of the seventh and eighth transistors are connected to output terminals and output from the output terminals an output voltage mixed according to an input voltage between the input terminals of the first and second input terminals, a local oscillator signal input from the set of local oscillator signal input terminals and a second local oscillator signal input from the second local oscillator signal input terminals.

Also, according to the invention, all the transistors included in the mixer circuit can be configured by NPN transistors.

Further, according to the invention, the variable gain amplifier circuit comprises a first and second input terminals, a first and second operational amplifiers whose negative inputs are connected to each of the first and second input terminals respectively, a first and second transistors whose bases are connected to each output of the first and second operational amplifiers respectively, a first and second constant current sources connected between each emitter of the first and second transistors and a ground terminal respectively, a third and fourth constant current sources connected between each collector of the first and second transistors and a power supply terminal respectively, a first resistor connected between the collectors of the first and second transistors, and a pair of transistors having the emitters connected to each emitter of the first and second transistors and the bases connected to each other, and a fifth and sixth transistors whose bases are connected to each other, wherein the collectors of the first and second transistors are connected to the positive inputs of the first and second operational amplifiers respectively, the commonly-connected bases of the pair of transistors are connected to input terminals for inputting a predetermined signal, and the commonly-connected bases of the fifth and sixth transistors, together with the commonly-connected bases of a third and fourth transistors forming the pair of transistors, are connected to a set of gain control signal input terminals, and each collector of the third and fourth transistors are connected to the power supply terminal respectively, the collector of the fifth transistor is coupled to the power supply terminal through the first load resistor and also connected a first output terminal, and the collector of the sixth transistor is coupled to the power supply terminal through the second load resistor and also connected to a second output terminal, and, in addition, a gain control signal is input to the set of input terminals instead of the local oscillator signal.

Also, according to the invention, all the transistors included in the variable gain amplifier circuit may be configured by NPN transistors.

Further, according to the invention, the differential amplifier circuit comprises a first and second input terminals, a first and second operational amplifiers whose negative inputs are connected to each of the first and second input terminals respectively, a first and second transistors whose gates are connected to each output of the first and second operational amplifiers respectively, a first and second constant current sources connected between each source of the first and second transistors and a ground terminal respectively, a third and fourth constant current sources connected between each drain of the first and second transistors and a power supply terminal respectively, a first resistor connected between the drains of the first and second transistors, and a pair of transistors having the sources connected to each source of the first and second transistors respectively and the gates connected to each other, wherein the drains of the first and second transistors are connected to the positive inputs of the first and second operational amplifiers respectively, the commonly-connected gates of the pair of transistors are connected to input terminals for inputting a predetermined signal, and the drains of the pair of transistors form a set of output terminals and output a set of output currents from the set of output terminals according to an input voltage applied between the first and second input terminals.

Also, according to the invention, all the transistors included in the differential amplifier circuit may be configured by N type field effect transistors.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Next, the invention will be described in detail with reference to the accompanying drawings.

Figure 1:
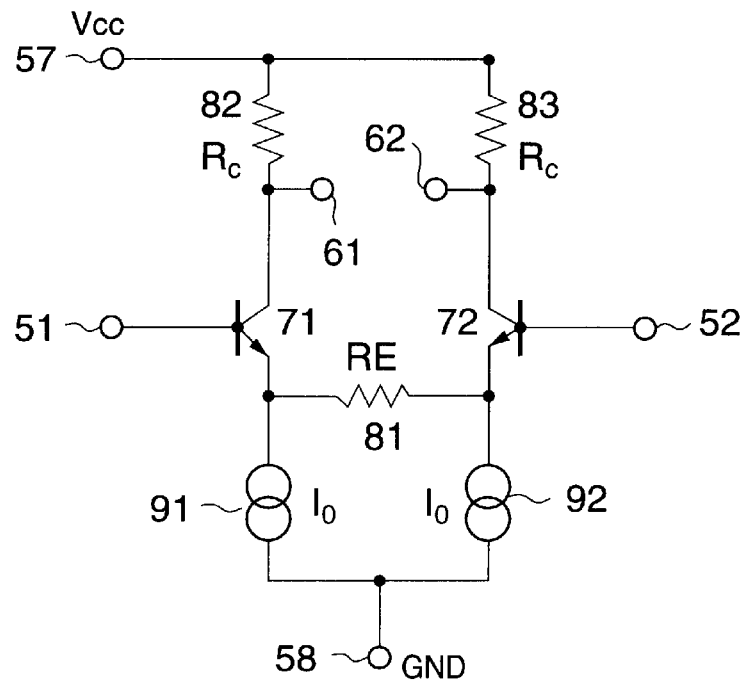
FIG. 1 is a circuit diagram showing a configuration of the most basic conventional differential amplifier circuit.
Figure 2:
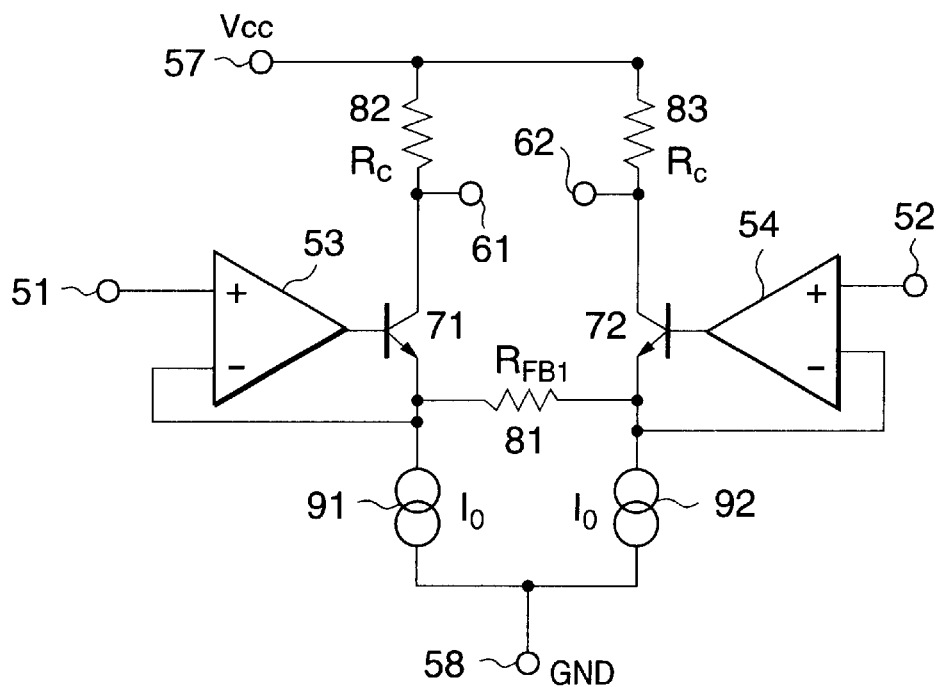
FIG. 2 is a circuit diagram showing the configuration of a first conventional differential amplifier circuit.
Figure 3:
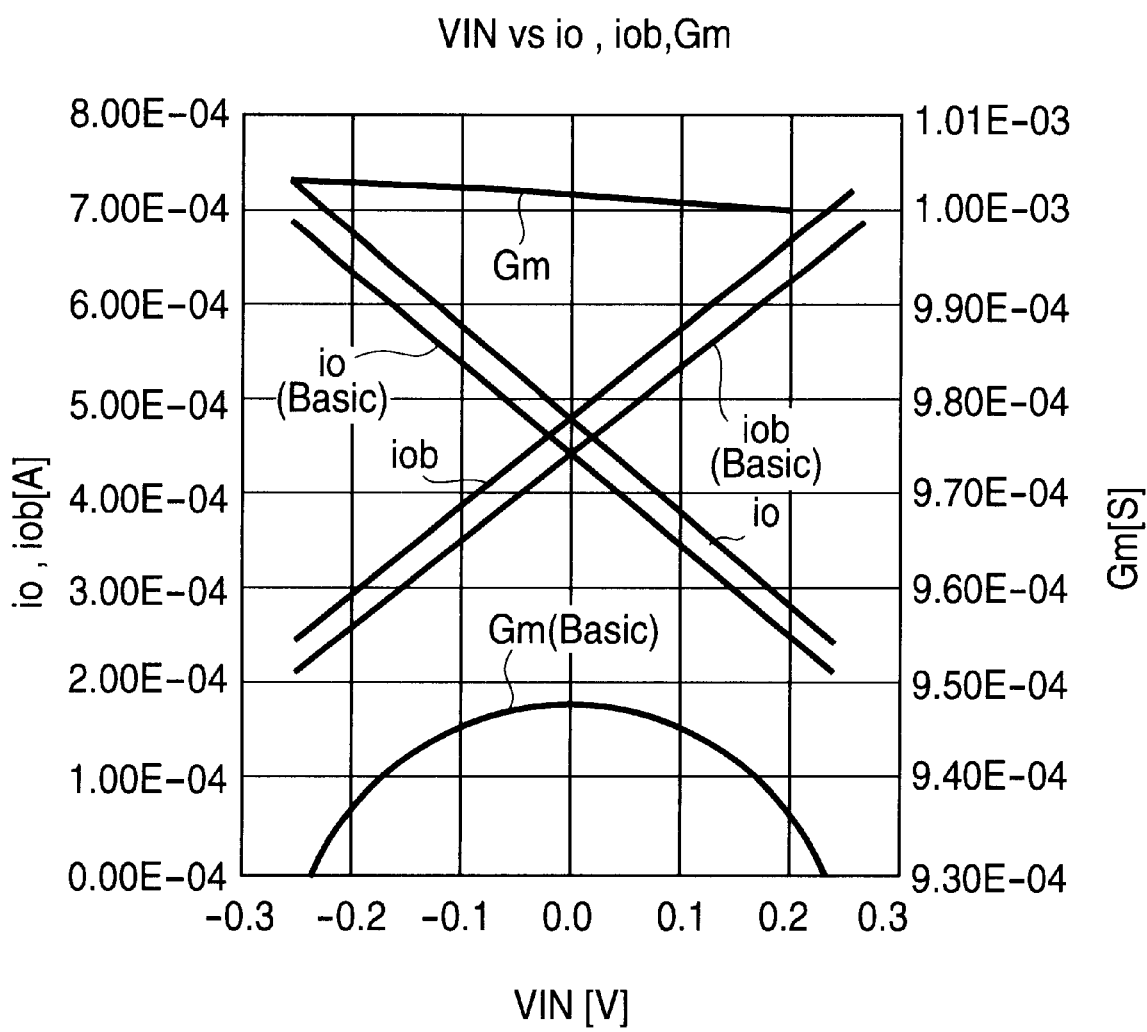
FIG. 3 is a characteristic diagram showing the changes of transconductance and output current with respect to input voltage in the first conventional differential amplifier circuit.
Figure 4:
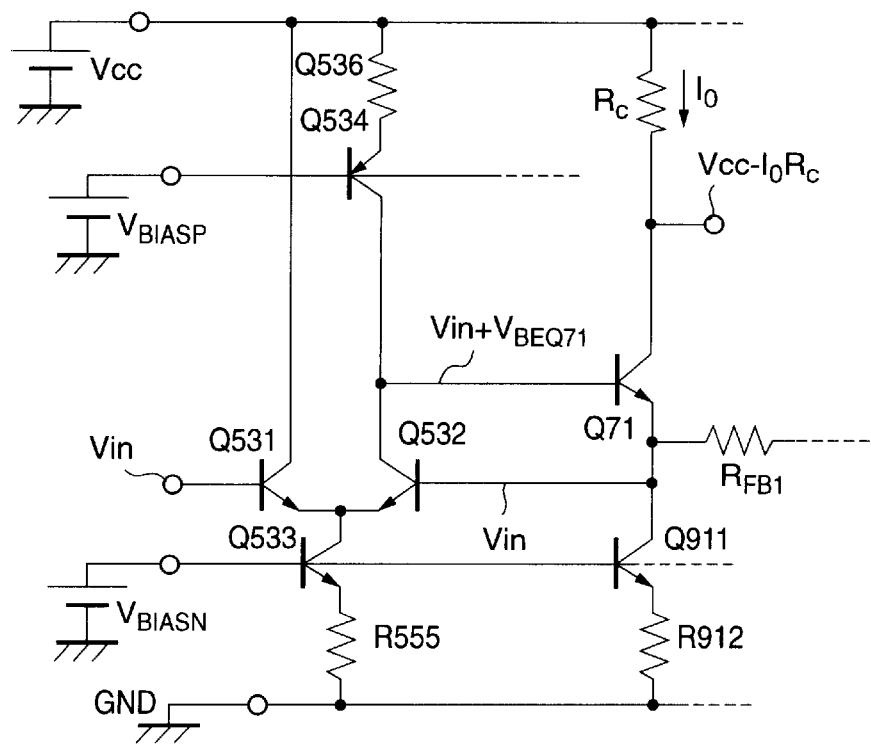
FIG. 4 is a circuit diagram showing the potential of nodes in the first conventional differential amplifier circuit.
Figure 5:
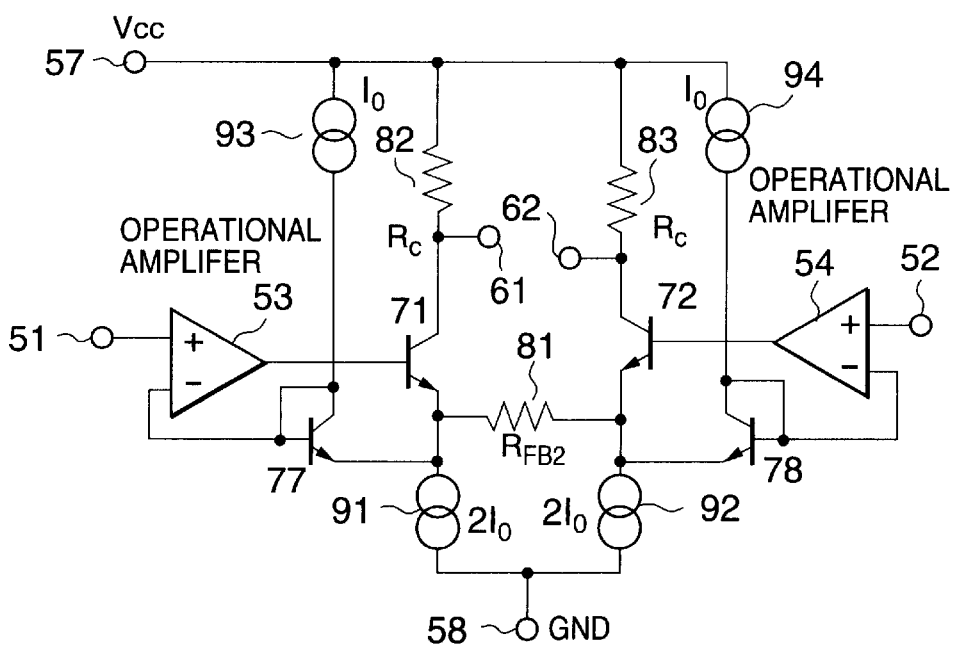
FIG. 5 is a circuit diagram showing the configuration of a second conventional differential amplifier circuit.
Figure 6:
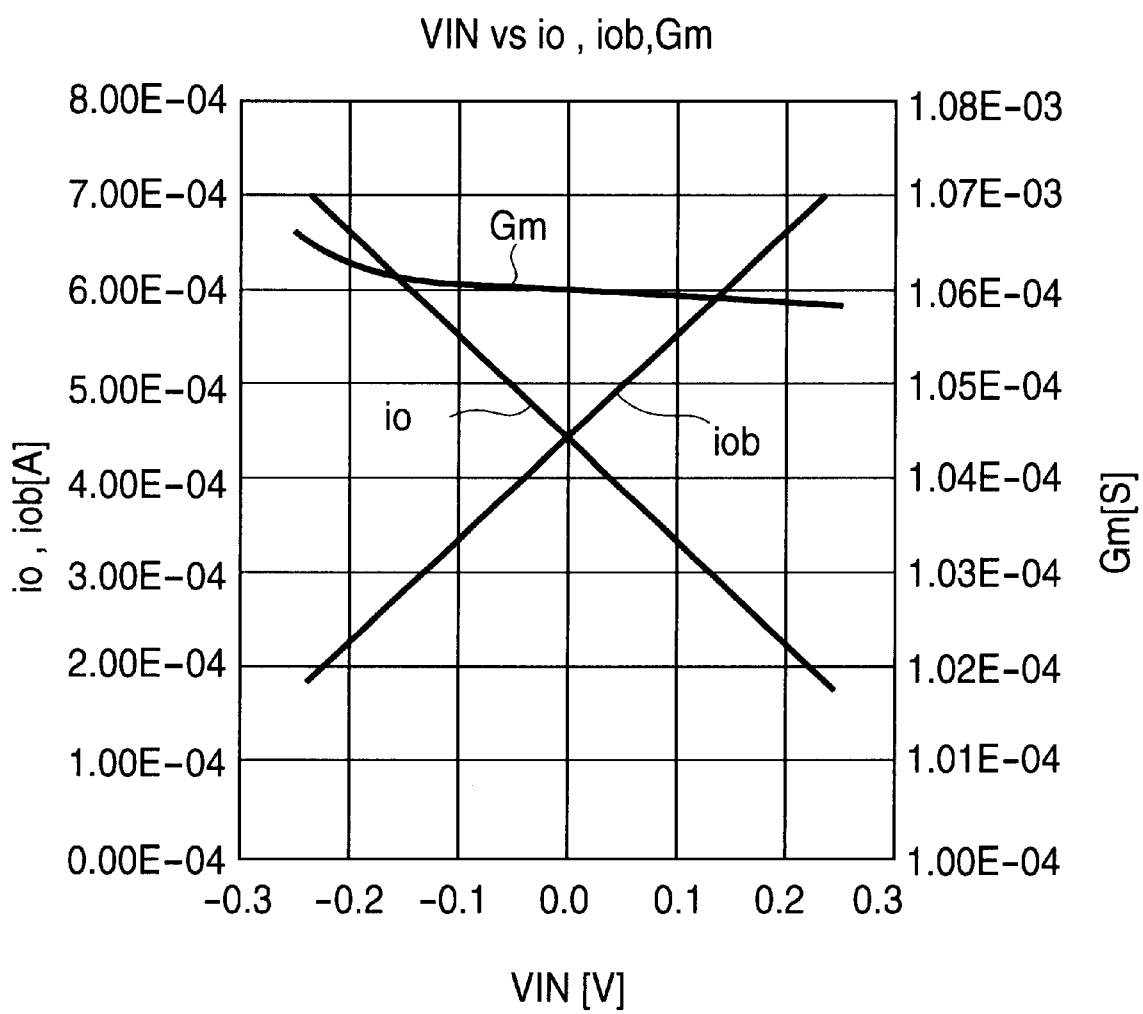
FIG. 6 is a characteristic diagram showing the changes of transconductance and output current with respect to input voltage in the second conventional differential amplifier circuit.
Figure 7:
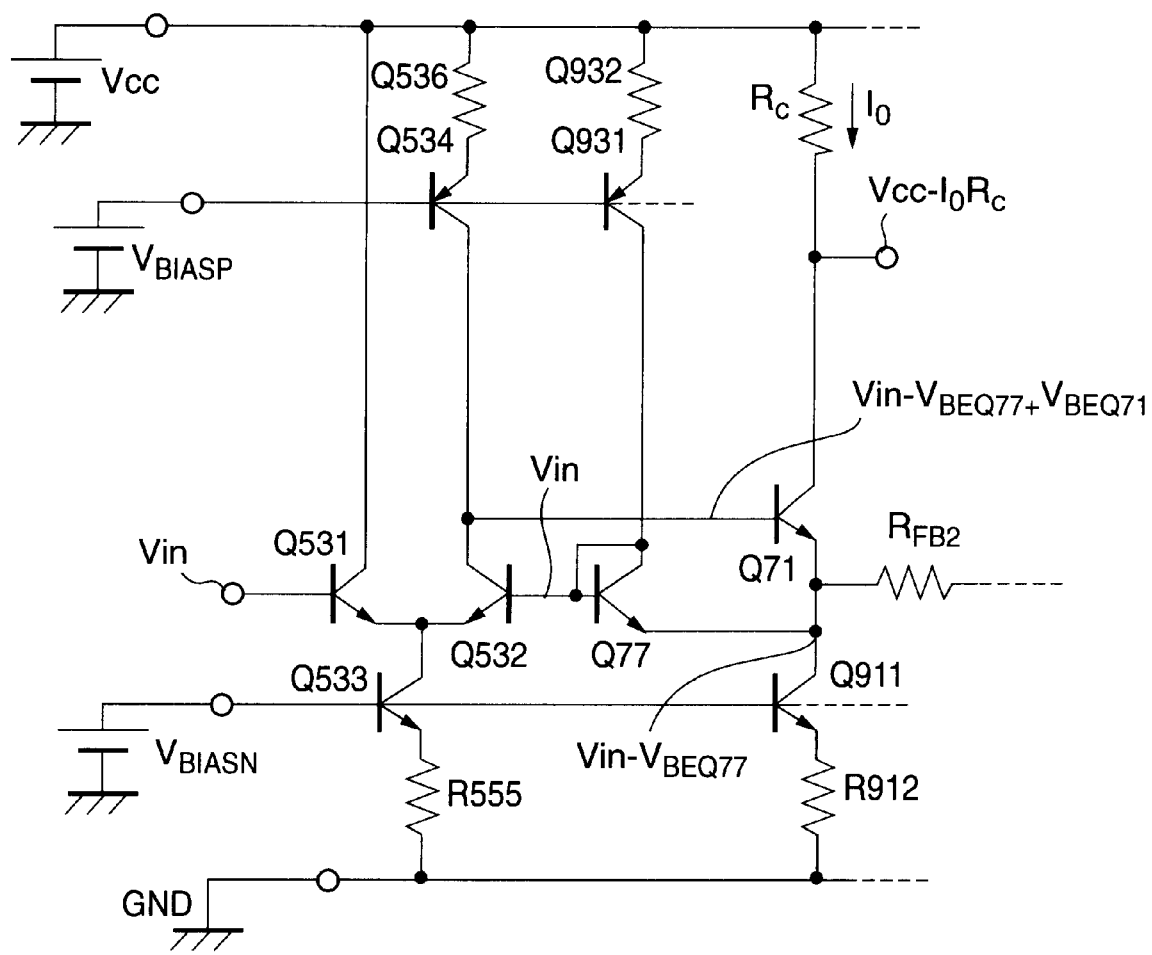
FIG. 7 is a circuit diagram showing the potential of nodes in the second conventional differential amplifier circuit.
Figure 8:
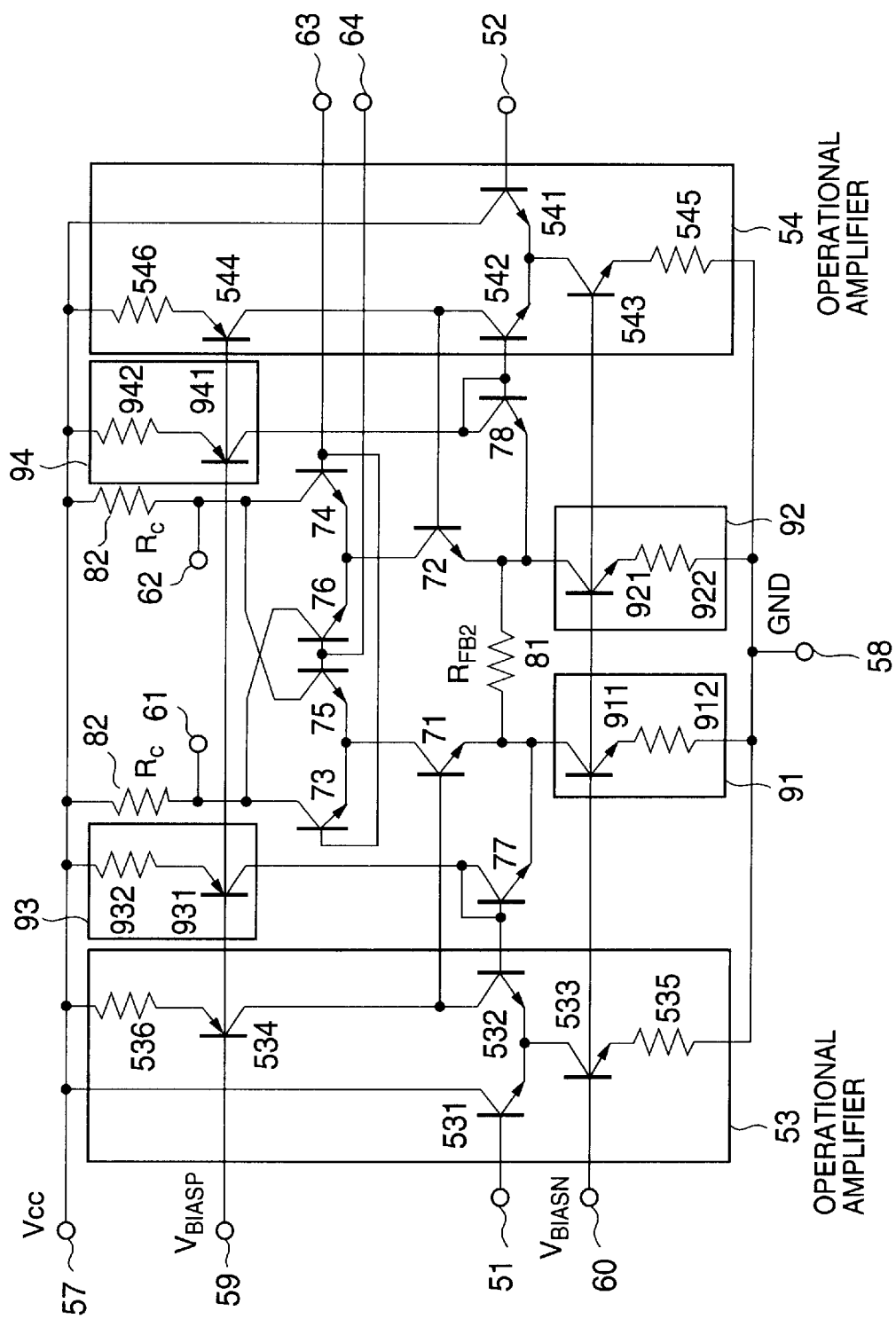
FIG. 8 is a circuit diagram showing the configuration of a mixer circuit using the second conventional differential amplifier circuit.
Figure 9:
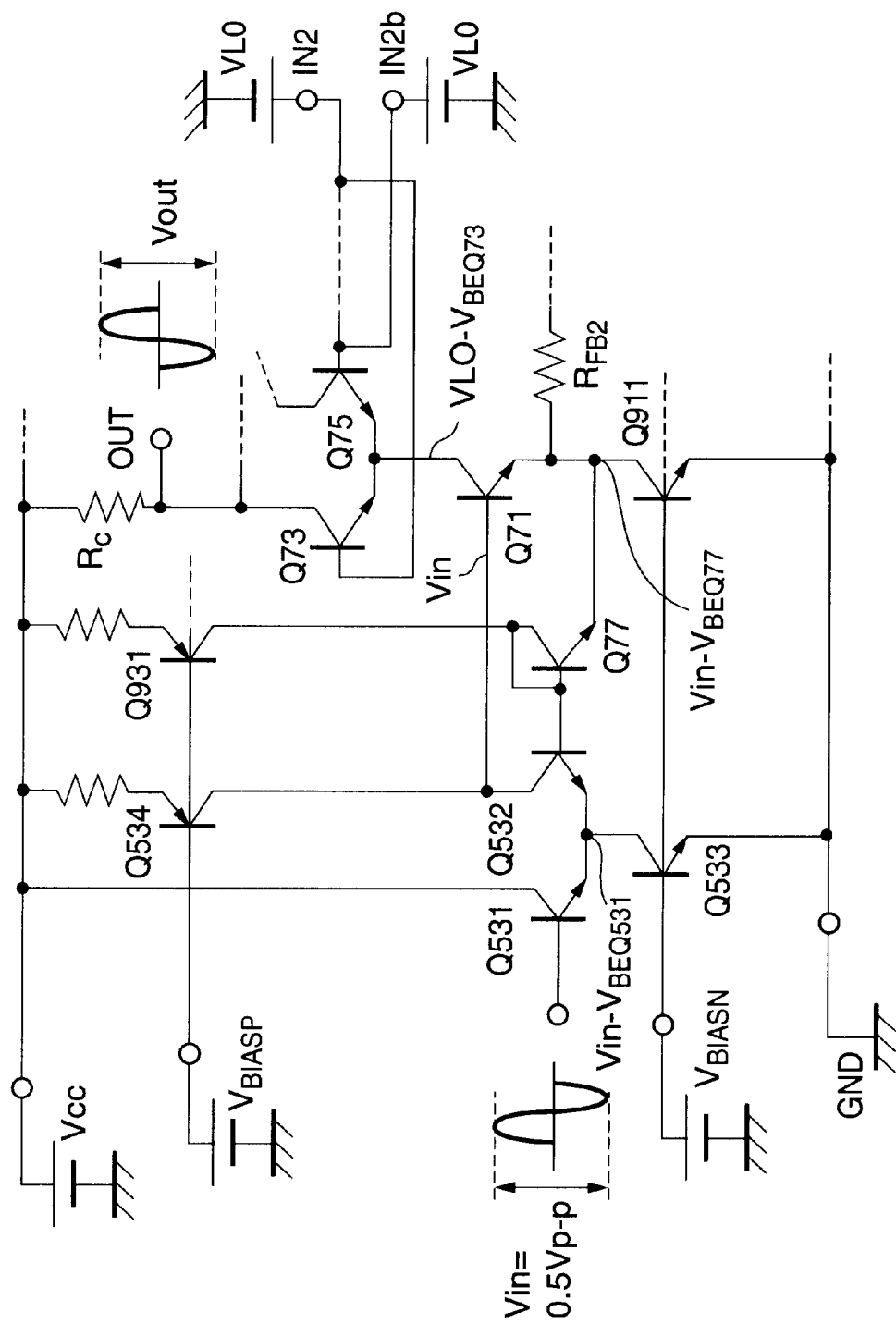
FIG. 9 is a circuit diagram showing the potential of nodes of them mixer circuit using the second conventional differential amplifier circuit.
Figure 10:
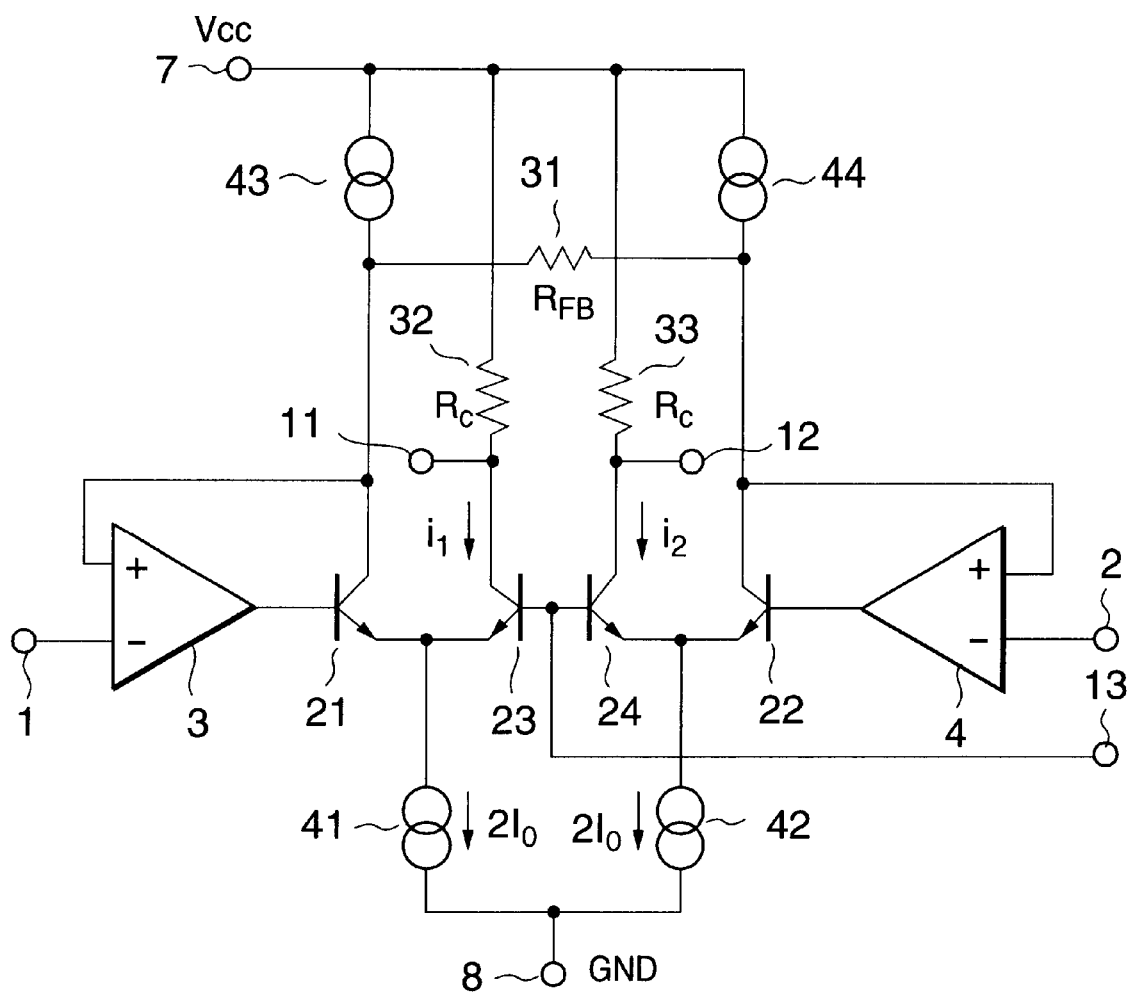
FIG. 10 is a circuit diagram showing the configuration of a differential amplifier circuit according to the first embodiment of the invention.

FIG. 10 is a circuit diagram showing a differential amplifier circuit according to the first embodiment of the invention.

Referring now to FIG. 10, the differential amplifier circuit according to the first embodiment of the invention comprises input terminals (1, 2), operational amplifiers (3, 4) having the negative inputs connected to the input terminals (1, 2) respectively, transistors (21, 22) having the bases connected to each output of the operational amplifiers (3, 4), constant current sources (41, 42) connected between each emitter of the transistors (21, 22) and a ground terminal (potential: 0) 8 respectively, constant current sources (43, 44) connected between each collector of the transistors (21, 22) and a power supply terminal (voltage: Vcc) 7 respectively, a resistor (resistance value: RFB) 31 connected between the collectors of the transistors (21, 22), transistors (23, 24) having the emitters connected to each emitter of the transistors (21, 22) respectively and having the bases connected to each other, and load resistors (32, 33) connected between each collector of the transistors (23, 24) and the power supply terminal 7 respectively.

Then, the collectors of the transistors (21, 22) are connected to each positive input of the operational amplifiers (3, 4) respectively, the commonly-connected bases of the transistors (23, 24) are connected to an input terminal 13 inputting a predetermined bias voltage, and the collectors of the transistors (23, 24) are connected to output terminals (11, 12) respectively, outputting an output voltage from the output terminals (11, 12) according to an input voltage applied between the input terminal 1 and the input terminal 2.

Next, description will be made for the operation of the differential amplifier circuit according to the first embodiment of the invention having the above-described configuration.

That is, in the differential amplifier circuit according to the first embodiment of the invention, an input voltage Vin input between a pair of the input terminals 1 and 2 is amplified through the operational amplifiers (3, 4) and then input to the base of the transistor 21 and the base of the transistor 22, respectively.

Herein, the transistors 21, 23 and the transistors 22, 24 each form differential amplifiers having the resistor 31 as a load resistance, and thus configure a pair of voltage followers, wherein an input signal is inversely amplified through the differentials amplifiers and then fed back to the positive inputs of the operational amplifiers (3, 4). That is, an input voltage Vin input to the input terminals (1, 2) is applied across the resistor 31 and thus linear current flows through the resistor 31.

In the circuit of FIG. 10, the resistance value of the resistor 31 is represented as RFB and the current flowing through the resistor 31 is represented as i, and then the relation between RFB and i can be expressed by the following equation.

$$i = (Vin/RFB) \quad (22)$$

On the other hand, no current flows through the positive inputs of the operational amplifiers 3 and 4. Also, due to constant current sources 43 and 44 connected between each collector of the transistors 21 and 22 and the power supply terminal 7, the linear current flowing through the resistor 31 is output through the emitters of the transistors 21 and 22, and input to the emitters of the transistors 23 and 24 as a positive and negative currents, respectively.

Further, if the transistors 23 and 24 have high current gain and negligible base currents, the emitter currents thereof are equal to the collector currents, and therefore linear current expressed by the equation (22) is fed through the load resistors 32 and 33.

Herein, clearly from the equation (22), the transconductance Gm of the differential amplifier circuit of FIG. 10 is expressed by the following equation.

$$Gm = (i/Vin) = (1/RFB) \quad (23)$$

Further, the above collector currents are converted into the corresponding voltages through the load resistors 32 and 33 inserted between each collector of the transistors 23 and 24 and the power supply terminal 7, and the voltages are output to the output terminals 11 and 12.

When the resistance value of the load resistors 32 and 33 is represented as Rc, the voltage gain G can be expressed by the following equation, using the equation (23).

$$G = Gm \cdot Rc = (Rc/RFB) \quad (24)$$

By the way, the linear Input Dynamic Range (IDR) of the differential amplifier circuit of FIG. 10 can be expressed by the following equation, wherein each current value of the constant current sources 41 and 42 is taken as 2I0, and the currents of the constant current sources 43 and 44 are taken as I0.

$$IDR = I0 \cdot RFB \quad (25)$$

Therefore, the differential amplifier circuit according to the first embodiment of the invention also is not affected by the non-linearity of the differential pair of the input transistors 21 and 22 as in the case of the conventional differential amplifier circuits, thus providing linear output voltages Vo proportional to the input voltages Vin.

Figure 11:
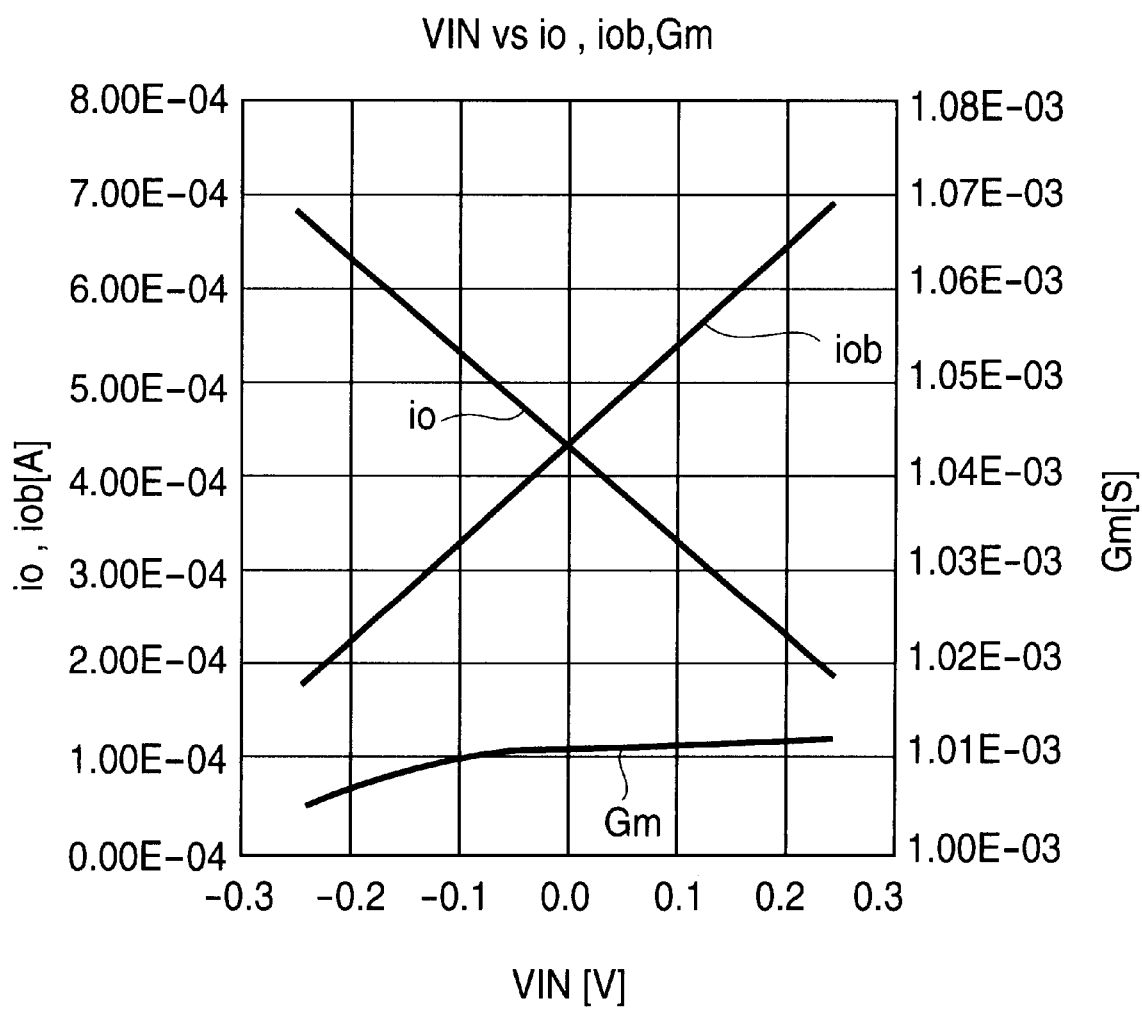
FIG. 11 is a characteristic diagram showing the changes of transconductance and output current with respect to input voltage in the differential amplifier circuit according to the first embodiment of the invention.

FIG. 11 shows an example of the relations of input voltage Vin and transconductance (Gm), and output current (io, iob) of the differential amplifier circuit according to the first embodiment of the invention shown in FIG. 10.

In the example shown in FIG. 11, it is assumed that the resistance value RFB of the resistor 31 is 2000Ω, the current value of the constant current sources 41 and 42 is 2I0, the current value of the constant current sources 43 and 44 is I0, wherein I0 is 0.45 mA.

Figure 12:
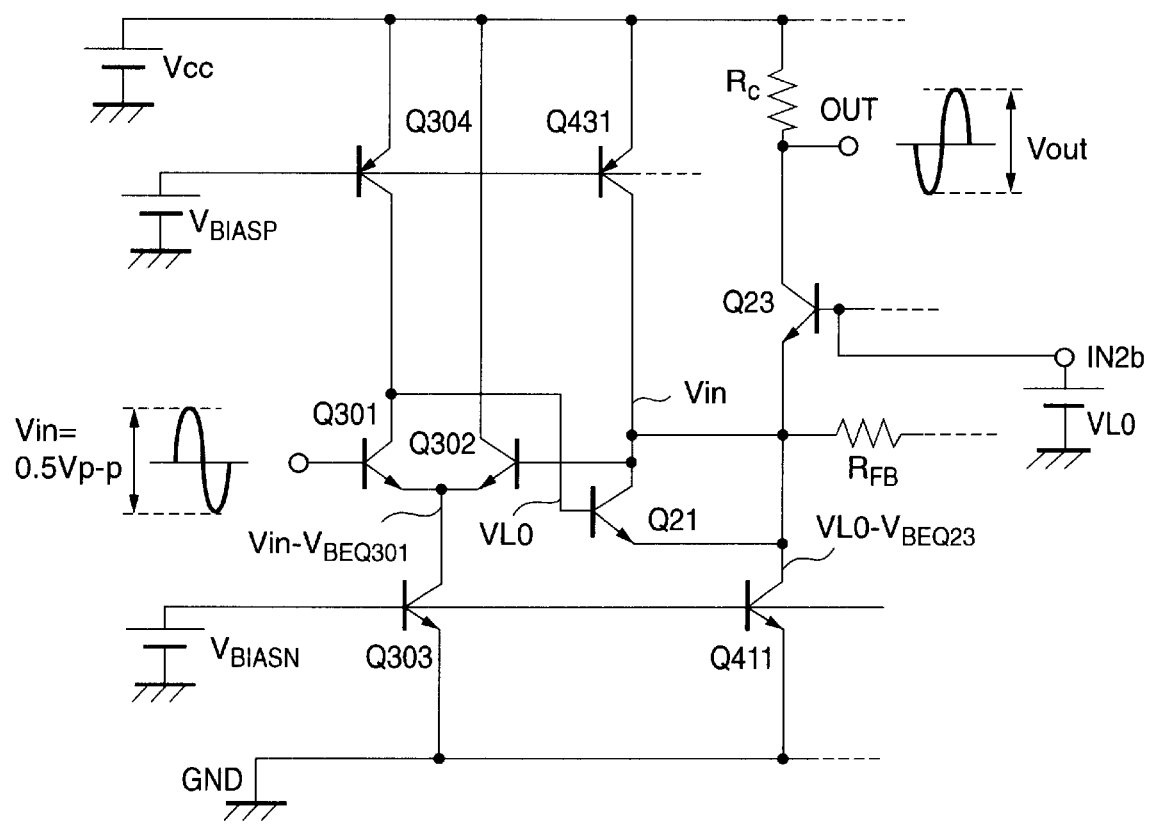
FIG. 12 is a circuit diagram showing the potential of nodes in the differential amplifier circuit according to the first embodiment of the invention.

The circuit diagram of FIG. 12 shows a configuration of the differential amplifier circuit according to the first embodiment of the invention and the potential of each node in the circuit. Herein, only a half of the circuit is shown because of the symmetry of the differential amplifier circuit.

Herein, the base of a transistor 302, the base and collector of a transistor 301 constitute the positive input, negative input and output of the operational amplifier 3 respectively, and a voltage follower is configured by a differential pair of transistors 21 and 23 and a differential pair of transistors 22 and 24. For this reason, if the potential of the input terminal 1 is Vin, then the base potential of the transistor 302 is Vin and the emitter potential of the transistor 23 is VLO−VBEQ23. Therefore, the base potential of the transistor 21 is (VLO−VBEQ23+VBEQ21).

Also, because the base-to-emitter voltages VBE of transistors are considered to be approximately constant, the base potential of the transistor 21 is eventually equal to VLO. That is, the collector potential of the transistor 21 is Vin and the collector potential of the transistor 301 is VLO, and also the base potential of the transistor 21 is VLO and the base potential of the transistor 301 is Vin. Therefore, from the symmetry of the circuits, the input voltage Vin and the bias voltage VLO are preferably nearly the same potential.

From this fact, the differential amplifier circuit according to the first embodiment of the invention can be operated at the same degree of low voltage as the second conventional differential amplifier circuit.

Next, the second embodiment of the invention will be described.

Figure 13:
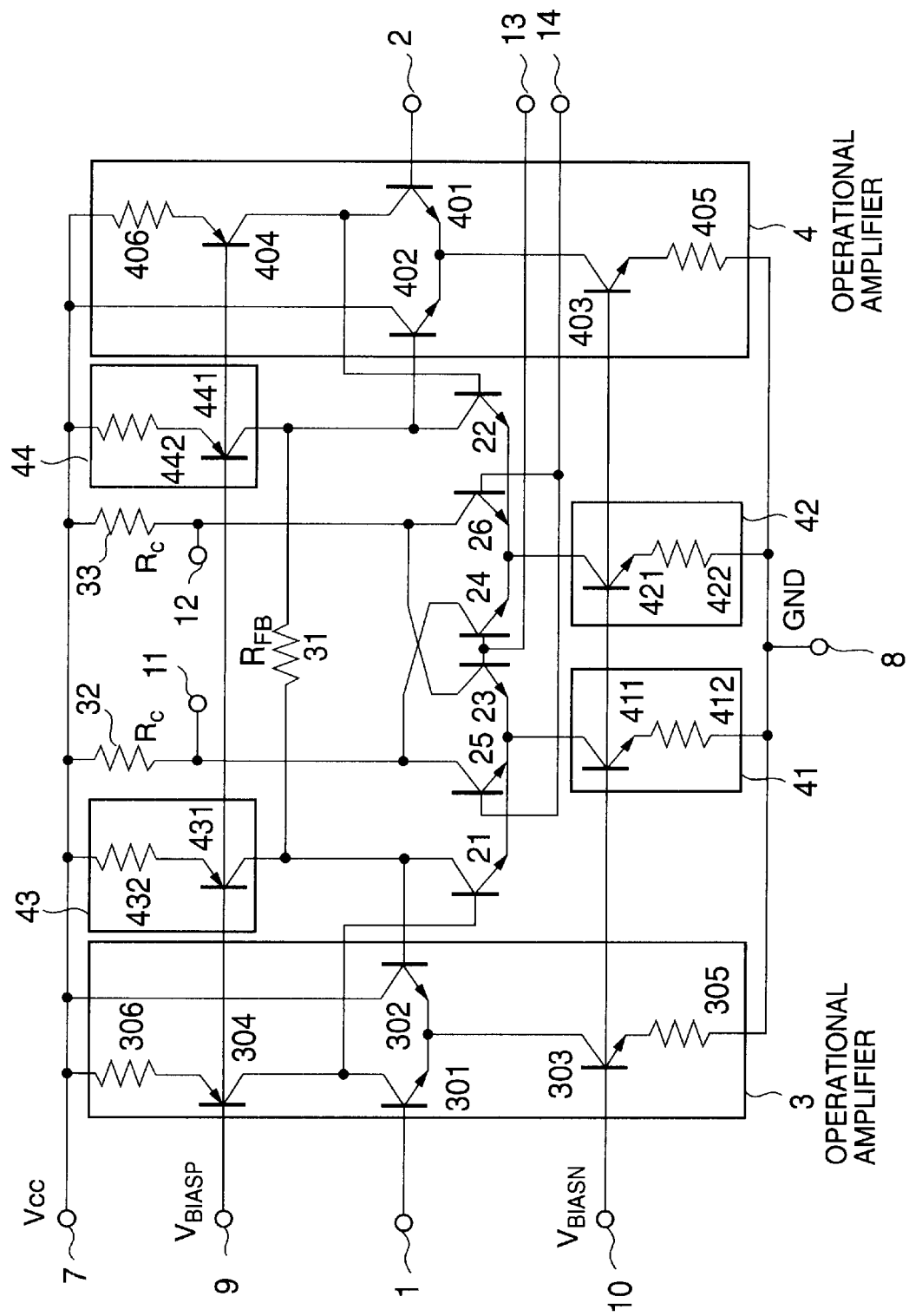
FIG. 13 is a circuit diagram showing the configuration of a mixer circuit according to the second embodiment of the invention.

FIG. 13 is a circuit diagram showing an example of applying the differential amplifier circuit to a mixer circuit as the second embodiment of the invention.

Referring now to FIG. 13, the mixer circuit using the differential amplifier circuit according to the second embodiment of the invention comprises transistors 25 and 26 having the bases connected to each other, in addition to the differential amplifier circuit according to the first embodiment of the invention.

Further, the commonly-connected bases of the transistors 23 and 24 and the commonly-connected bases of the transistor 25 and 26 are connected to a pair of local oscillator signal input terminals 13 and 14 respectively, each collector of the transistors 23 and 24 is connected to the collectors of the transistors 26 and 25, respectively, and also coupled to the power supply terminal 7 through the load resistors 32 and 33. Also, the collectors of the transistors 23 and 24 are connected to the output terminals 11 and 12, and output from the output terminal 11 and 12 an output voltage mixed according to an input voltage between the input terminals 1 and 2 and a local oscillator signal input from the pair of local oscillator signal input terminals 13 and 14.

Next, description will be made for the operation of the mixer circuit using the differential amplifier circuit according to the second embodiment of the invention having the above configuration.

That is, in the respect that an input voltage Vin input between the pair of input terminals 1 and 2 causes positive and negative linear currents to flow through the emitters of the transistors 21 and 22 respectively, the mixer circuit using the differential amplifier circuit according to the second embodiment of the invention is the same as in the case of the differential amplifier circuit according to the first embodiment of the invention.

Also, a signal current i output through the emitters of the transistors 21 and 22, transconductance Gm, and the linear input voltage range IDR in this embodiment can be expressed by the equations (22), (23) and (25) respectively, which is also the same as in the differential amplifier circuit according to the first embodiment of the invention.

Also, the conversion gain CG in the present embodiment can be expressed by the following equation from the equation (24), in the same manner as in the case of applying the second conventional differential amplifier circuit to a mixer circuit.

$$CG = (2/\pi) \cdot (Rc/RFB) \quad (26)$$

From this equation (26), increased conversion gain CG requires the increased resistance value Rc of the load resistors 32 and 33. For this reason, it can be understood that the base potential of the transistor 23 (or 24, 25, 26) is preferably lower. Therefore, the lowest base potential of the transistor 23 (or 24, 25, 26) will be calculated.

Figure 14:
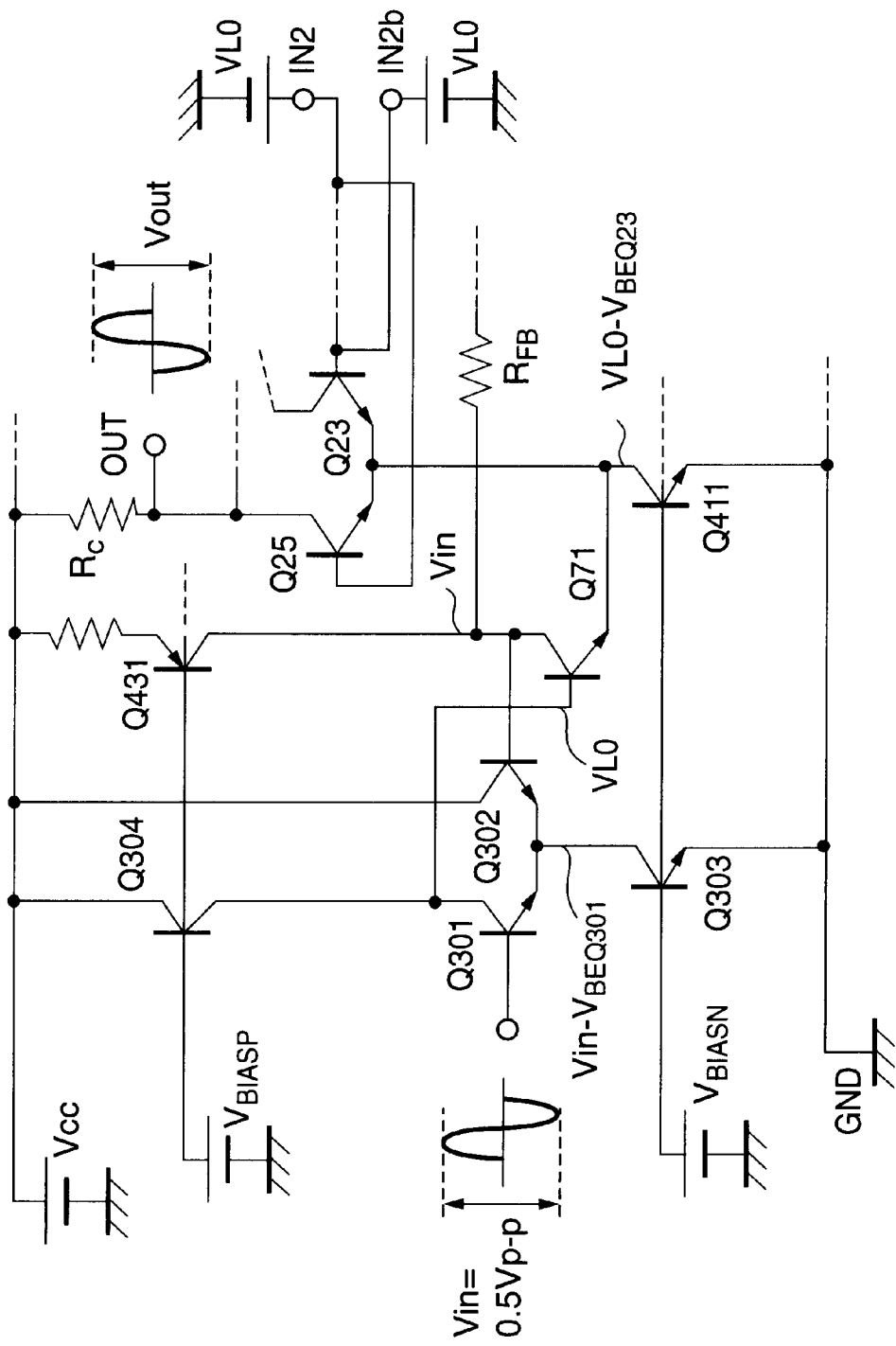
FIG. 14 is a circuit diagram showing the potential of nodes in the mixer circuit according to the second embodiment of the invention.

The circuit diagram of FIG. 14 shows a configuration of a mixer circuit using the differential amplifier circuit according to the second embodiment of the invention, and the potential of each node in the mixer circuit. Herein, only a half of the circuit is shown because of the symmetry of the differential amplifier circuit. Further, for the purpose of simplicity, the voltage drops developed across emitter resistors of constant current supply transistors will be neglected.

First, when Vin is lowest, the condition under which a constant current supply transistor 303 can not be saturated is expressed by the following equation.

$$Vin\ (min) \geq VCE(sat)Q303 + VBEQ301 \quad (27)$$

Therefore, the lowest input voltage Vin (min) can be expressed by the following equation from the equation (27).

$$Vin\ (min) = VCE(sat)Q303 + VBEQ301 \quad (28)$$

Next, when Vin is highest, the condition under which the transistor 301 can be not saturated is expressed by the following equation.

$$VLO \geq Vin\ (max) - VBEQ301 + VCE(sat)Q301 \quad (29)$$

However, when the base potential of the transistor 23 decreases, the constant current supply transistor 411 can become saturated. The following equation represents the condition under which the transistor 411 can not be saturated.

$$VLO \geq VCE(sat)G411 + VBEQ23 \quad (30)$$

Therefore, the lowest base potential of the transistor 23 is either higher one of the potential represented by the two following equations, from the equations (29) and (30).

$$VLO = Vin\ (max) - VBEQ301 + VCE(sat)Q301 \quad (31a)$$

$$VLO = VCE(sat)Q411 + VBEQ23 \quad (31b)$$

Further, when the supply voltage is Vcc, the largest range of the output amplitude V0 can be expressed by any one of the two following equations.

$$\Delta V0 = Vcc - (VLO - VBEQ23 + VCE(sat)Q23) = Vcc - (Vin\ (max) - VBEQ301 + VCE(sat)Q301 - VBEQ23 + VCE(sat)Q23) \quad (32a)$$

$$\Delta V0 = Vcc - (VLO - VBEQ23 + VCE(sat)Q23) = Vcc - (VCE(sat)Q411 + VBEQ23 - VBEQ23 + VCE(sat)Q23) \quad (32b)$$

On the other hand, in order to prevent the saturation of the transistors caused by decreased voltage and temperature variations, it is desirable that the dc potential of output signals is set at the center of the output voltage range ΔV0 given by the equation (32a) or (32b) so as to provide the widest range of linear output voltage.

This fact requires the two relations expressed by following equations.

$$(\Delta V0/2) = I0 \cdot Rc \tag{33}$$

$$CG = (2/\pi) \cdot (1/RFB) \cdot (\Delta V0/2I0) \tag{34}$$

Herein, assuming that the power supply voltage Vcc is 1.8 V, the input voltage Vin is 0.5 Vp-p, and the base-to-emitter voltage VBE and the collector-to-emitter saturation voltage VCE(sat) of the transistors are constant voltages of 0.7 V and 0.15 V respectively, first from equation (28), the minimum value Vin (min) of the input voltages is expressed by the following equation.

$$\text{Vin (min)} = 0.15 + 0.7 = 0.85 \tag{35}$$

Also, the maximum value Vin (max) of the input voltages is expressed by the following equation.

$$\text{Vin (max)} = \text{Vin (min)} + \text{Vin} = 0.85 + 0.5 = 1.35 \tag{36}$$

Then, by substituting the value of the equation (36) into the equation (31a), the following value is obtained.

$$VLO = 1.35 - 0.7 + 0.15 = 0.8 \tag{37}$$

Further, the equation (31b) becomes the following value.

$$VLO = 0.15 + 0.7 = 0.85 \tag{38}$$

Because of a higher potential of the equation (38) when the equation (37) and the equation (38) are compared, the lowest base potential of the transistor 23 results in 0.85 V. Therefore, by substituting the value of the equation (38) into the equation (32b), the output voltage range $\Delta V0$ is given by the following equation.

$$\Delta V0 = 1.8 - (0.85 - 0.7 + 0.15) = 1.5 \tag{39}$$

That is, the output voltage range $\Delta V0$ is 1.5 Vp-p, and this means that the output voltage range can occupy nearly 83% of the supply voltage Vcc.

Further, assuming that RFB2 is 2000Ω and I0 is 0.45 mA, the conversion gain CG becomes about 0.530 (times) from the equation (34).

From this fact, in the mixer circuit using the differential amplifier circuit according to the second embodiment of the invention, the output voltage range thereof can be made nearly 36% wider, and the conversion gain CG thereof can be made 1.76 times larger than those in the case of applying the second conventional differential amplifier circuit to a mixer circuit.

Next, a third embodiment of the invention will be described.

Figure 15:
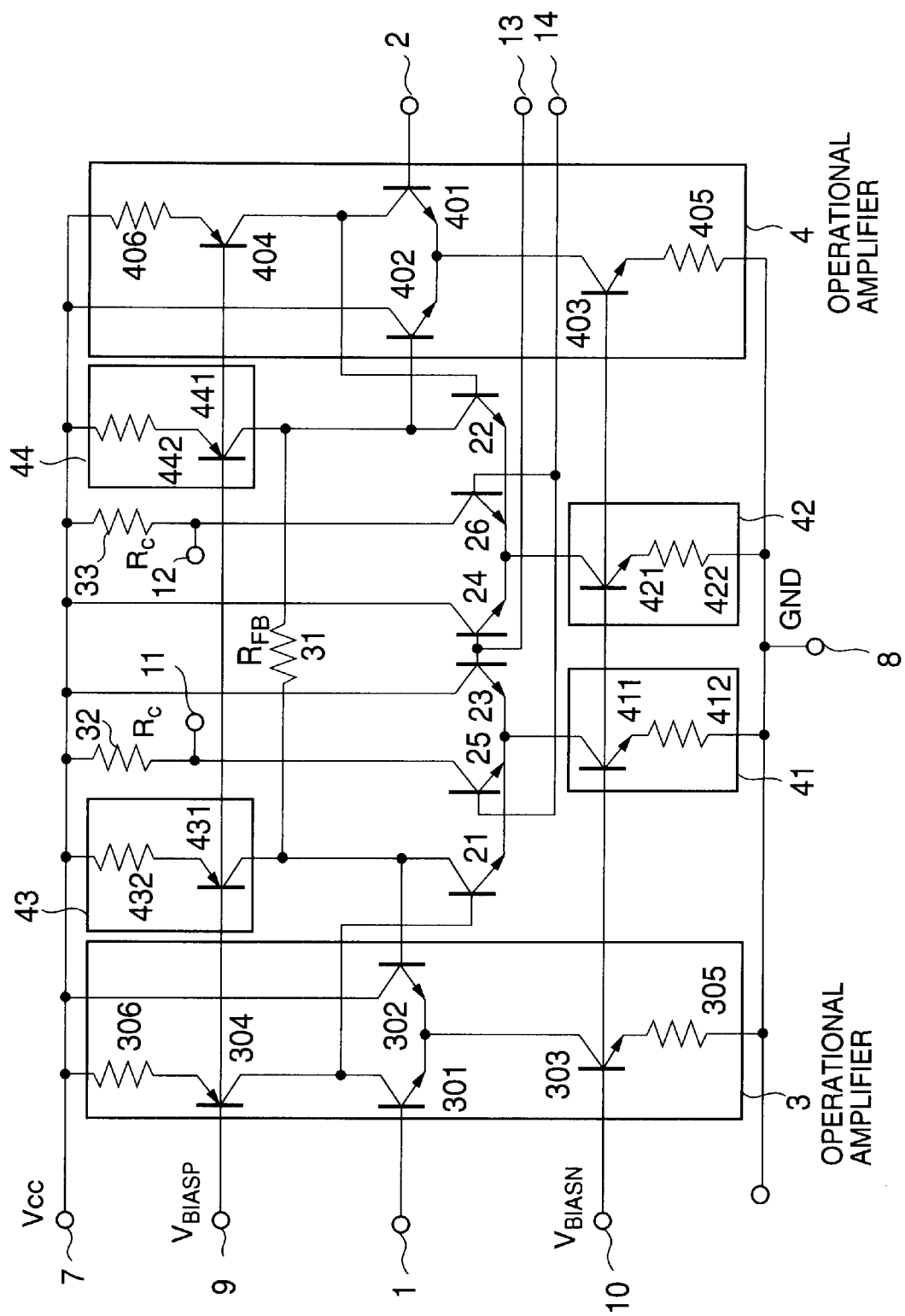
FIG. 15 is a circuit diagram showing the configuration of a variable gain amplifier circuit according to the third embodiment of the invention.

FIG. 15 is a circuit diagram showing an example of applying the differential amplifier circuit to a variable gain amplifier circuit as the third embodiment of the invention.

Referring now to FIG. 15, in a variable gain amplifier circuit using a differential amplifier circuit according to the third embodiment of the invention, changes are made in the respective collector connections of the transistors 23, 24, 25 and 26 included in the mixer circuit of the second embodiment, and further a gain control signal is input to the pair of input terminals 13 and 14 instead of a local oscillator signal.

Also, each collector of the transistors 25 and 26 is coupled to the power supply terminal 7 through the load resistors 32 and 33 respectively, and at the same time, connected to the output terminals 11 and 12, respectively. Further, the collectors of the transistors 23 and 24 each are connected to the power supply terminal 7.

Next, description will be made for the operation of the variable gain amplifier circuit using the differential amplifier circuit according to the third embodiment of the invention having the above configuration.

Here, in the respect that an input voltage Vin input between the pair of input terminals 1 and 2 causes positive and negative linear currents to flow through the respective emitters of the transistors 21 and 22, the variable gain amplifier circuit using the differential amplifier circuit according to the third embodiment of the invention is the same as in the case of the differential amplifier circuit according to the first embodiment or the mixer circuit using the differential amplifier circuit according to the second embodiment of the invention.

Also, a signal current i output through the emitters of the transistors 21 and 22, transconductance Gm, and the linear input voltage range IDR for this embodiment can be expressed by the equations (22), (23) and (25) respectively, which is also the same as in the first or second embodiment.

Also, when a gain control signal input between the input terminals 13 and 14 is represented as Vd, the gain G in the present embodiment can be expressed by the following equation.

$$G = Gm \cdot \frac{Rc}{1 + e^{-\frac{Vd}{VT}}} \tag{40}$$

Therefore, the maximum gain Gmax can be expressed by the following equation from the equation (40).

$$Gmax = \lim_{Vd \to \infty} Gm \cdot \frac{Rc}{1 + e^{-\frac{Vd}{VT}}} = Gm \cdot Rc \tag{41}$$

Here, from the equation (41), increased maximum gain Gmax requires the increased resistance value Rc of the load resistors 32 and 33. For this reason, it can be understood that the base potential of the transistor 23 (or 24, 25, 26) is preferably lower as in the case of the mixer circuit of the second embodiment.

In the same manner as in the mixer circuit of the second embodiment, in the case of the variable gain amplifier circuit according to the third embodiment, the lowest base potential of the transistor 23 can be calculated. Further, assuming that the power supply voltage Vcc is 1.8 V, the input voltage Vin is 0.5 Vp-p, and the base-to-emitter voltage VBE and the collector-to-emitter saturation voltage VCE(sat) of the transistors are constant voltages of 0.7 V and 0.15 V respectively, then the base potential of the transistor 23 becomes 0.85 V and the output voltage range $\Delta V0$ becomes 1.5 Vp-p.

Also, because the equation (33) is held for this embodiment as in the case of the mixer circuit of the second embodiment, the following relationship can be derived from the equations (41), (33) and (22).

$$Gmax = Gm \cdot Rc = (1/RFB) \cdot (\Delta V0/2I0) \tag{42}$$

Therefore, the maximum gain Gmax is obtained as 0.833 (times) from the equation (42).

Clearly from this fact, in the variable gain amplifier circuit using the differential amplifier circuit according to the third embodiment of the invention, the output voltage range thereof can be made nearly 36% wider, and the gain G thereof can be made 1.76 times larger than those in the case of applying the second conventional differential amplifier circuit to a variable gain amplifier circuit.

Figure 16:
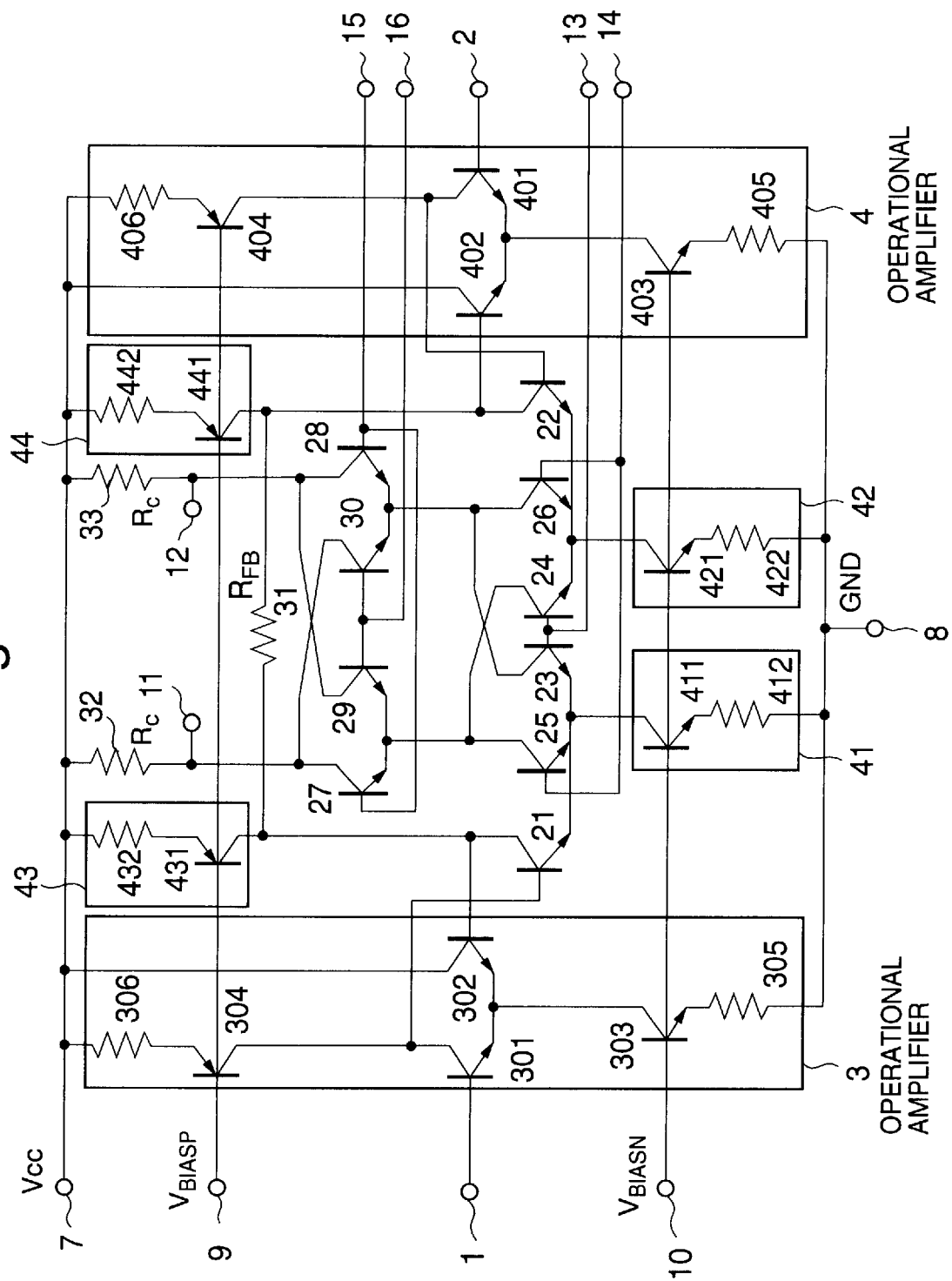
FIG. 16 is a circuit diagram showing the configuration of a three-input mixer circuit according to the fourth embodiment of the invention.

Next, a fourth embodiment of the invention will be described. FIG. 16 is a circuit diagram showing an example of applying the differential amplifier circuit to a three-input mixer circuit as the fourth embodiment of the invention.

Referring now to FIG. 16, a three-input mixer circuit using the differential amplifier circuit according to the fourth embodiment of the invention comprises transistors 27 and 28 having the bases connected to each other and transistors 29 and 30 having the bases connected to each other, in addition to the mixer circuit using the differential amplifier circuit according to the second embodiment of the invention.

Further, the commonly-connected bases of the transistors 27 and 28 and the commonly-connected bases of the transistors 29 and 30 are connected to a pair of second local oscillator signal input terminals 15 and 16, respectively. Further, the collectors of the transistors 27 and 28 are connected to the collectors of the transistors 30 and 29, respectively, and at the same time, coupled to the power supply terminal 7 through the load resistors 32 and 33. Furthermore, the collectors of the transistors 27 and 28 are connected to the output terminals 11 and 12, thus outputting from the output terminals 11 and 12 an output signal mixed according to an input voltage between the input terminals 1 and 2, a local oscillator signal input from the pair of the local oscillator signal input terminals 13 and 14 and a second local oscillator signal input from the pair of the second local oscillator signal input terminals 15 and 16.

Further, the emitters of the transistors 27 and 29 are connected to each other and then connected to the collector of the transistor 24. Also, the emitters of the transistors 28 and 30 are connected to each other and then connected to the collector of the transistor 23.

Next, description will be made for the operation of the three-input mixer circuit using the differential amplifier circuit according to the fourth embodiment of the invention having the above configuration.

Herein, this three-input mixer circuit is the same as in the cases of the differential amplifier circuits according to the first to third embodiments of the invention in the respect that an input voltage Vin between the pair of input terminals 1 and 2 causes positive and negative linear currents to flow through the respective emitters of the transistors 21 and 22.

Also, a signal current i output through the emitters of the transistors 21 and 22, transconductance Gm, and the linear input voltage range IDR in this embodiment can be expressed by the equations (22), (23) and (25), respectively, which is also the same as in the case of the first, second, or third embodiment.

Also, provided that the dual differential pairs configured by the transistors 27, 28, 29, and 30 are under switching operation by the second local oscillator signal input from the second local oscillator signal input terminals 15 and 16, the conversion gain CG in the present embodiment can be expressed by the following equation from the equation (26), in the same manner as in the case of the mixer circuit of the second embodiment.

$$CG = \left(\frac{2}{\pi}\right)^2 \frac{Rc}{R_{FB}} \quad (43)$$

By the way, when the lowest base potential of the transistor 23 in the mixer circuit using the differential amplifier circuit according to the second embodiment of the invention is compared with the lowest base potential of the transistor 73 in the second conventional mixer circuit, it can be understood that there is a potential difference of about 0.65 V between them, which is nearly equal to the base-to-emitter voltage VBE of transistors. That is, it is possible to realize the three-input mixer circuit with the same power supply voltage as that of the second conventional mixer circuit.

Next, a differential amplifier circuit according to the fifth embodiment of the invention will be described with reference to an accompanying drawing.

Figure 17:
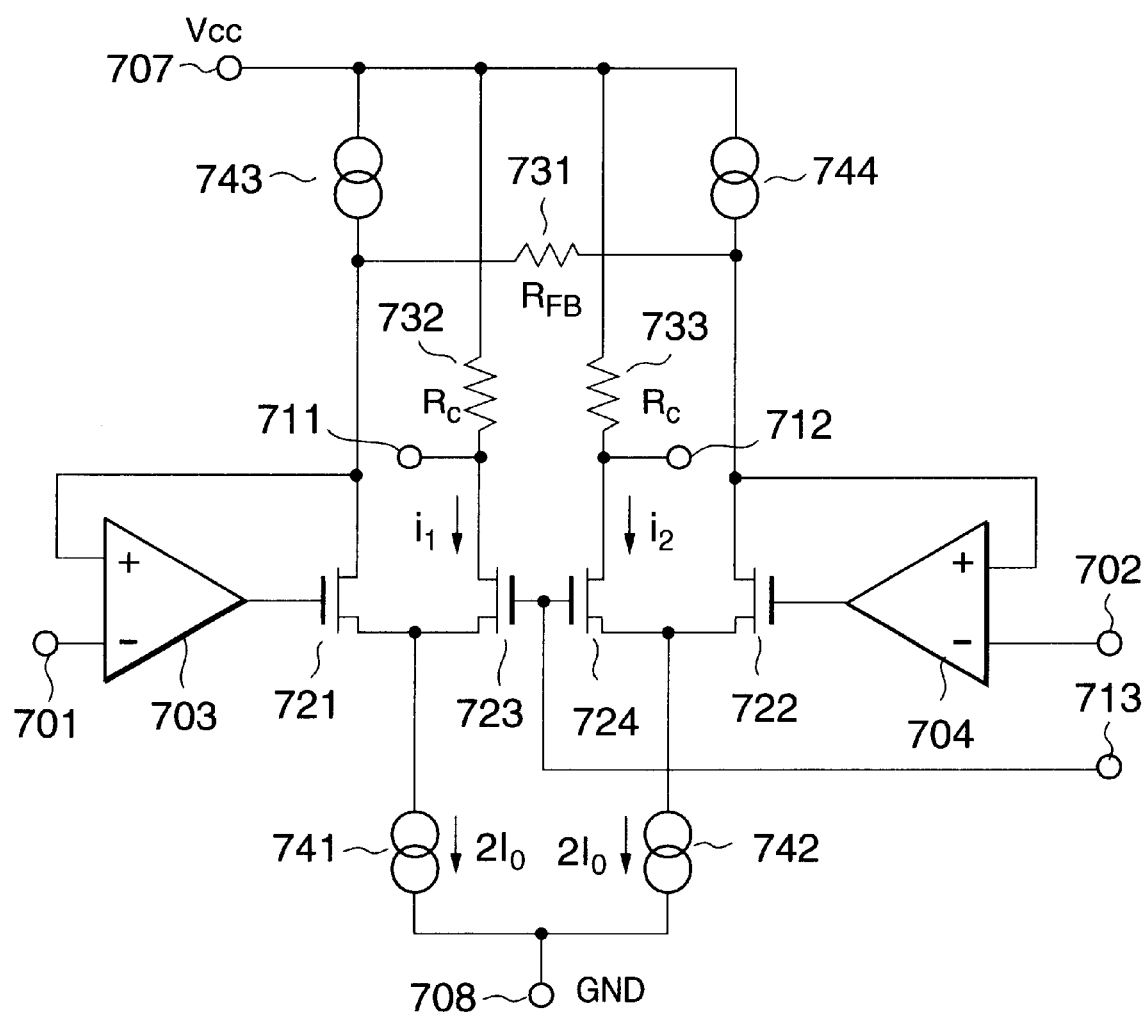
FIG. 17 is a circuit diagram showing the configuration of a differential amplifier circuit according to the fifth embodiment of the invention.

FIG. 17 is a circuit diagram showing the differential amplifier circuit according to the fifth embodiment of the invention.

Referring now to FIG. 17, the differential amplifier circuit according to the fifth embodiment of the invention comprises input terminals (701, 702), operational amplifiers (703, 704) having the negative inputs connected to the input terminals (701, 702) respectively, transistors (721,722) having the gates connected to each output of the operational amplifiers (703, 704) respectively, constant current source (741, 742) connected between each source of the transistors (721, 722) and a ground terminal (potential: 0) 708 respectively, constant current sources (743, 744) connected between each drain of the transistors (721, 722) and a power supply terminal (voltage: Vcc) 707 respectively, a resistor (resistance value: RFB) 731 connected between the drains of the transistors (721, 722), transistors (723, 724) having the sources connected to each source of the transistors (721, 722) respectively and having the gates connected to each other, and load resistors (732, 733) connected between each drain of the transistors (723, 724) and the power supply terminal 707 respectively.

Then, the drains of the transistors (721, 722) are connected to the positive inputs of the operational amplifiers (703, 704) respectively, the commonly-connected gates of the transistors (723, 724) are connected to an input terminal 713 for inputting a predetermined bias voltage, and the drains of the transistors (723, 724) are connected to output terminals (711, 712) respectively, outputting an output voltage from the output terminals (711, 722) according to an input voltage applied between the input terminal 701 and the input terminal 702.

Next, description will be made for the operation of the differential amplifier circuit according to the fifth embodiment of the invention having the above-described configuration.

That is, in the differential amplifier circuit according to the fifth embodiment of the invention, an input voltage Vin between a pair of the input terminals 701 and 702 is amplified through the operational amplifiers (703, 704) and then input to the gate of the transistor 721 and the gate of the transistor 722, respectively.

Herein, the transistors 721, 723 and the transistors 722, 724 each form differential amplifiers having the resistor 731 as a load resistance, and thus configure a pair of voltage followers, wherein an input signal is inversely amplified through the differentials amplifiers and then fed back to the positive inputs of the operational amplifiers (703, 704) thereby configuring a pair of voltage follower. That is, an input voltage Vin to the input terminals (701, 702) is applied across the resistor 731 and thus linear current flows through the resistor 731.

In the circuit of FIG. 17, the resistance value of the resistor 731 is represented as RFB and the current flowing through the resistor 731 is represented as i7, and then the relation between RFB and i7 can be expressed by the following equation.

$$i7 = (Vin/RFB) \quad (722)$$

On the other hand, no current flows through the positive inputs of the operational amplifiers 703 and 704. Also, due to constant current sources 743 and 744 connected between each drain of the transistors 721 and 722 and the power supply terminal 707, the linear current flowing through the resistor 731 is output through the sources of the transistors 721 and 722, and input to the sources of the transistors 723 and 724 as a positive and negative currents, respectively.

Further, the gate current of the transistors 723 and 724 can be neglected because they are MOS transistors. Therefore, the source currents thereof are equal to the drain currents. Thus, a linear current given by the equation (722) is supplied to the load resistors 732 and 733.

Herein, clearly from the equation (22), the transconductance Gm7 of the differential amplifier circuit of FIG. 17 is expressed by the following equation.

$$Gm7=(i/Vin)=(1/RFB) \tag{723}$$

Further, the above drain currents are converted into the corresponding voltages through the load resistors 732 and 733 inserted between each drain of the transistors 723 and 724 and the power supply terminal 707, and then the voltages are output to the output terminals 711 and 712.

When the resistance value of the load resistors 732 and 733 is represented as Rc, the voltage gain G can be expressed by the following equation, using the equation (723).

$$G=Gm7 \cdot Rc=(Rc/RFB) \tag{724}$$

On the other hand, the linear Input Dynamic Range (IDR) of the differential amplifier circuit of FIG. 17 can be expressed by the following equation, wherein each current value of the constant current sources 741 and 742 is taken as $2I_0$, and the currents of the constant current sources 743 and 744 are taken as I0.

$$IDR = I0 \cdot RFB \tag{725}$$

Therefore, the differential amplifier circuit according to the fifth embodiment of the invention also is not affected by the non-linearity of the differential pair of the input transistors 721 and 722 as in the case of the differential amplifier circuit according to the first embodiment of the invention, thus providing linear output voltages Vo according to input voltages Vin.

Although the embodiments suitable for the invention have been described up to this point, the differential amplifier circuits according to the invention is not limited to the above first to fifth embodiments and the invention includes the differential amplifier circuits obtained by giving various modification and change to these embodiments.

For example, although bipolar transistors have been used for the above second to fourth embodiments, it is needless to say that MOS transistor may be used therefor.

Also, the resistance values of resistors and the connection sequence and connection number of dual differential pairs and gain control sections are not limited to those described in the embodiments of the first to fifth, and any change may be allowed, provided that the action and effect of the invention can be achieved.

As described above, the differential amplifier circuit according to the invention allows mixer circuits and variable gain amplifier circuits to be configured with two vertical stacks of transistors. Therefore, it has an advantage of realizing high gain but with low distortion even during low voltage operation. Further, it has also an advantage of realizing a three-input mixer circuit having low distortion at lower voltage.

What is claimed is:

1. A differential amplifier circuit comprising:

a first and second input terminals, a first and second operational amplifiers having negative inputs connected to each of said first and second input terminals respectively, a first and second transistors having bases connected to each output of said first and second operational amplifiers respectively, a first and second constant current sources connected between each emitter of said first and second transistors and a ground terminal respectively, a third and fourth constant current sources connected between each collector of said first and second transistors and a power supply terminal respectively, a first resistor connected between the collectors of said first and second transistors, and a pair of transistors having emitters connected to each emitter of said first and second transistors and having bases commonly connected to each other, wherein the collectors of said first and second transistors are connected to the positive inputs of said first and second operational amplifiers respectively, the commonly-connected bases of said pair of transistors are connected to input terminals for inputting a predetermined signal, and the collectors of said pair of transistors form a set of output terminals and output a set of output currents from said set of output terminals according to an input voltage applied between said first and second input terminals.

2. The differential amplifier circuit according to claim 1, wherein all said transistors are configured by NPN transistors.

3. A mixer circuit comprising:

a first and second input terminals, a first and second operational amplifiers having negative inputs connected to each of said first and second input terminals respectively, a first and second transistors having bases connected to each output of said first and second operational amplifiers respectively, a first and second constant current sources connected between each emitter of said first and second transistors and a ground terminal respectively, a third and fourth constant current sources connected between each collector of said first and second transistors and a power supply terminal respectively, a first resistor connected between the collectors of said first and second transistors, a pair of transistors having emitters connected to each emitter of said first and second transistors and having bases commonly connected to each other, and a fifth and sixth transistors having bases commonly connected to each other, wherein the collectors of said first and second transistors are connected to the positive inputs of said first and second operational amplifiers respectively, the commonly-connected bases of said pair of transistors are connected to input terminals for inputting a predetermined signal, and the commonly-connected bases of said fifth transistor and said sixth transistor, together with the commonly-connected bases of a third and fourth transistors forming said pairs of transistors, are connected to a set of local oscillator signal input terminals, and the collectors of said third and fourth transistors are connected to the collectors of said sixth transistor and said fifth transistor respectively and also coupled to the power supply terminal through a first and second load resistors.

4. The mixer circuit according to claim 3, further having:

a seventh and eighth transistors having bases connected to each other, and a ninth and tenth transistors having bases commonly connected to each other, wherein the commonly-connected bases of said seventh and eighth transistors and the commonly-connected bases of said ninth and tenth transistors are connected to a set of second local oscillator signal input terminals, each collector of said seventh and eighth transistors is connected to each collector of said tenth and ninth transistors respectively and also coupled to the power supply terminal through said first and second load resistor respectively, the emitters of said seventh and ninth transistors are commonly connected to each other and also connected to the collector of said fifth transistor, the emitters of said eighth and tenth transistors are commonly connected to each other and also connected to the collector of said sixth transistor, the collectors of said seventh and eighth transistors are connected to output terminals and output from said output terminals an output voltage mixed according to an input voltage between the input terminals of said first and second input terminals, a local oscillator signal input from the set of local oscillator signal input terminals and a second local oscillator signal input from the set of second local oscillator signal input terminals.

5. The mixer circuit according to claim 3, wherein all said transistors are configured by NPN transistors.

6. The mixer circuit according to claim 4, wherein all said transistors are configured by NPN transistors.

7. A variable gain amplifier circuit comprising:

a first and second input terminals, a first and second operational amplifiers having negative inputs connected to each of said first and second input terminals respectively, a first and second transistors having bases connected to each output of said first and second operational amplifiers respectively, a first and second constant current sources connected between each emitter of said first and second transistors and a ground terminal respectively, a third and fourth constant current sources connected between each collector of said first and second transistors and a power supply terminal respectively, a first resistor connected between the collectors of said first and second transistors, and a pair of transistors having emitters connected to each emitter of said first and second transistors and having bases commonly connected to each other, and a fifth and sixth transistors having bases commonly connected to each other, wherein the collectors of said first and second transistors are connected to the positive inputs of said first and second operational amplifiers respectively, the commonly-connected bases of said pair of transistors are connected to input terminals for inputting a predetermined signal, and the commonly-connected bases of said fifth and sixth transistors, together with the commonly-connected bases of a third and fourth transistors forming said pair of transistors, are connected to a set of gain control signal input terminals, and the collector of said third and fourth transistors are connected to the power supply terminal, the collector of said fifth transistor is coupled to said power supply terminal through said first load resistor and also connected to a first output terminal, the collector of said sixth transistor is coupled to said power supply terminal through said second resistor and also connected to a second output terminal, in addition, a gain control signal is input to the set of input terminals instead of the local oscillator signal.

8. The variable gain amplifier according to claim 7, wherein all said transistors are configured by NPN transistors.

9. A differential amplifier circuit comprising:

a first and second input terminals, a first and second operational amplifiers having negative inputs connected to each of said first and second input terminals respectively, a first and second transistors having gates connected to each output of said first and second operational amplifiers respectively, a first and second constant current sources connected between each source of said first and second transistors and a ground terminal respectively, a third and fourth constant current sources connected between each drain of said first and second transistors and a power supply terminal respectively, a first resistor connected between the drains of said first and second transistors, and a pair of transistors having sources connected to each source of said first and second transistors and having gates commonly connected to each other, wherein the drains of said first and second transistors are connected to the positive inputs of said first and second operational amplifiers respectively, the commonly-connected gates of said pair of transistors are connected to input terminals for inputting a predetermined signal, and the drains of said pair of transistors form a set of output terminals respectively and output a set of output currents from said set of output terminals according to an input voltage applied between said first and second input terminals.

10. The differential amplifier circuit according to claim 9, wherein all said transistors are configured by N type field effect transistors.

* * * * *